United States Patent
Liaw

(10) Patent No.: US 11,121,129 B2
(45) Date of Patent: Sep. 14, 2021

(54) SEMICONDUCTOR DEVICE

(71) Applicant: Taiwan Semiconductor Manufacturing Co., Ltd., Hsinchu (TW)

(72) Inventor: Jhon-Jhy Liaw, Hsinchu County (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 184 days.

(21) Appl. No.: 16/164,789

(22) Filed: Oct. 18, 2018

(65) Prior Publication Data

US 2020/0043918 A1 Feb. 6, 2020

Related U.S. Application Data

(60) Provisional application No. 62/712,222, filed on Jul. 31, 2018.

(51) Int. Cl.
| | |
|---|---|
| *H01L 27/088* | (2006.01) |
| *H01L 23/528* | (2006.01) |
| *H01L 29/417* | (2006.01) |
| *H01L 29/423* | (2006.01) |
| *H01L 23/48* | (2006.01) |

(52) U.S. Cl.
CPC ........ *H01L 27/0886* (2013.01); *H01L 23/481* (2013.01); *H01L 23/528* (2013.01); *H01L 29/41791* (2013.01); *H01L 29/4232* (2013.01)

(58) Field of Classification Search
CPC .......... H01L 29/4232; H01L 29/41791; H01L 27/0886; H01L 23/481; H01L 23/5283
See application file for complete search history.

(56) References Cited

U.S. PATENT DOCUMENTS

| | | | | |
|---|---|---|---|---|
| 6,404,030 B1 * | 6/2002 | Ma | ....................... | H01L 23/4824 257/210 |
| 6,465,294 B1 * | 10/2002 | Tsai | ................... | H01L 21/7681 257/E21.507 |
| 7,053,465 B2 * | 5/2006 | Benaissa | ............. | H01L 27/0808 257/312 |
| 7,989,868 B2 * | 8/2011 | Rieh | ....................... | H01L 29/93 257/312 |
| 7,999,392 B2 * | 8/2011 | Ohtake | ............... | H01L 23/5226 257/775 |

(Continued)

OTHER PUBLICATIONS

Yeh et al., The Impact of Fin Number on Device's Performance and Reliability in Tri-gate FinFETs, 2017 IEEE Electron Devices Technology and Manufacturing Conference Proceedings of Technical Papers, pp. 17-19 (Year: 2017).*

*Primary Examiner* — Earl N Taylor
(74) *Attorney, Agent, or Firm* — JCIPRNET

(57) ABSTRACT

Provided is a semiconductor device including a substrate, a gate structure, a first metal layer, and a gate via. The substrate has at least three semiconductor fins to define an active region. The gate structure is across the at least three semiconductor fins and extends along a first direction. The first metal layer extends along a second direction and is disposed over the gate structure. The gate via is disposed between the gate structure and the first metal layer. The gate via has a longitudinal axis extending along the first direction and across the first metal layer. A length of the longitudinal axis of the gate via is greater than a width of the first metal layer.

20 Claims, 15 Drawing Sheets

(56) References Cited

U.S. PATENT DOCUMENTS

| | | | |
|---|---|---|---|
| 8,143,159 B2* | 3/2012 | King | H01L 23/485 438/672 |
| 8,247,846 B2* | 8/2012 | Becker | H01L 21/76816 257/211 |
| 8,399,931 B2* | 3/2013 | Liaw | H01L 27/1104 257/369 |
| 8,582,352 B2* | 11/2013 | Liaw | H01L 27/1108 365/154 |
| 8,658,524 B2* | 2/2014 | Herberholz | H01L 23/4824 438/587 |
| 8,772,109 B2 | 7/2014 | Colinge | |
| 8,785,285 B2 | 7/2014 | Tsai et al. | |
| 8,816,444 B2 | 8/2014 | Wann et al. | |
| 8,823,065 B2 | 9/2014 | Wang et al. | |
| 8,860,148 B2 | 10/2014 | Hu et al. | |
| 9,105,490 B2 | 8/2015 | Wang et al. | |
| 9,236,267 B2 | 1/2016 | De et al. | |
| 9,236,300 B2 | 1/2016 | Liaw | |
| 9,520,482 B1 | 12/2016 | Chang et al. | |
| 9,576,814 B2 | 2/2017 | Wu et al. | |
| 9,595,582 B2* | 3/2017 | Lee | H01L 29/0692 |
| 9,735,157 B1* | 8/2017 | Chun | H01L 27/0886 |
| 9,793,407 B2* | 10/2017 | Chang | H01L 29/785 |
| 9,978,750 B1* | 5/2018 | Adusumilli | H01L 21/26506 |
| 10,199,271 B1* | 2/2019 | Xie | H01L 29/45 |
| 10,211,151 B2* | 2/2019 | Briggs | H01L 21/76877 |
| 10,262,950 B1* | 4/2019 | Alston | H01L 21/823487 |
| 10,333,007 B2* | 6/2019 | Lu | H01L 23/485 |
| 10,515,894 B2* | 12/2019 | Briggs | H01L 21/76816 |
| 10,522,423 B2* | 12/2019 | Liaw | H01L 21/823814 |
| 10,593,604 B1* | 3/2020 | Lam | G06K 9/6202 |
| 2005/0179113 A1* | 8/2005 | Kim | H01L 29/94 257/595 |
| 2007/0010092 A1* | 1/2007 | Zhou | H01L 21/76816 438/638 |
| 2012/0139020 A1* | 6/2012 | Chen | H01L 29/93 257/296 |
| 2013/0258759 A1* | 10/2013 | Liaw | H01L 27/0924 365/154 |
| 2014/0035056 A1* | 2/2014 | Liaw | H01L 27/1104 257/369 |
| 2014/0038412 A1* | 2/2014 | Hu | H01L 21/76811 438/689 |
| 2014/0127835 A1* | 5/2014 | Wang | H01L 22/12 438/7 |
| 2015/0279780 A1* | 10/2015 | Zhang | H01L 21/76897 257/774 |
| 2015/0279784 A1* | 10/2015 | Zhang | H01L 23/528 257/750 |
| 2015/0372085 A1* | 12/2015 | Lee | H01L 29/4238 257/387 |
| 2016/0056153 A1* | 2/2016 | Do | H01L 27/11807 257/390 |
| 2016/0211251 A1* | 7/2016 | Liaw | H01L 21/76897 |
| 2016/0284799 A1* | 9/2016 | Yoon | H01L 29/0653 |
| 2016/0336183 A1* | 11/2016 | Yuan | H01L 21/76895 |
| 2017/0098608 A1* | 4/2017 | Jung | H01L 23/5286 |
| 2017/0170320 A1* | 6/2017 | Chang | H01L 29/66545 |
| 2018/0053721 A1* | 2/2018 | Adusumilli | H01L 21/76877 |
| 2018/0158811 A1* | 6/2018 | Subhash | H01L 27/0207 |
| 2018/0182856 A1* | 6/2018 | Lee | H01L 23/5226 |
| 2018/0204800 A1* | 7/2018 | Adusumilli | H01L 23/5283 |
| 2018/0226323 A1* | 8/2018 | Do | H01L 27/11807 |
| 2018/0366592 A1* | 12/2018 | Lu | H01L 23/485 |
| 2019/0067131 A1* | 2/2019 | Liaw | H01L 29/0847 |
| 2019/0131399 A1* | 5/2019 | Liu | H01L 21/0257 |
| 2019/0287902 A1* | 9/2019 | Liaw | H01L 27/0886 |
| 2020/0006545 A1* | 1/2020 | Liu | H01L 21/324 |
| 2020/0043918 A1* | 2/2020 | Liaw | H01L 23/481 |

\* cited by examiner

SEMICONDUCTOR DEVICE

CROSS-REFERENCE TO RELATED APPLICATION

This application claims the priority benefits of U.S. provisional application Ser. No. 62/712,222, filed on Jul. 31, 2018. The entirety of the above-mentioned patent application is hereby incorporated by reference herein and made a part of this specification.

BACKGROUND

In nanometer (nm) generations, the fin-type field effect transistors (FinFETs) have become most popular candidate for high performance and lower leakage application. With the rapid growth of semiconductor technology, the size of the FinFETs is continued to shrink, especially to shrink the gate length and gate height for both high density and high performance requirements. This narrow gate length and lower gate height benefit the transistor capacitance on both gate to channel and gate to contact. However, this gate shrinking will also result in the higher gate resistance, thereby impacting the gate delay of the high performance device. In 10 nm or under 10 nm generation, the narrower and longer gate electrode will face a trade-off between gate capacitance and gate resistance. In other word, how to solve the above problems will become an important key for the next generation technology.

DETAILED DESCRIPTION

Figure 1:
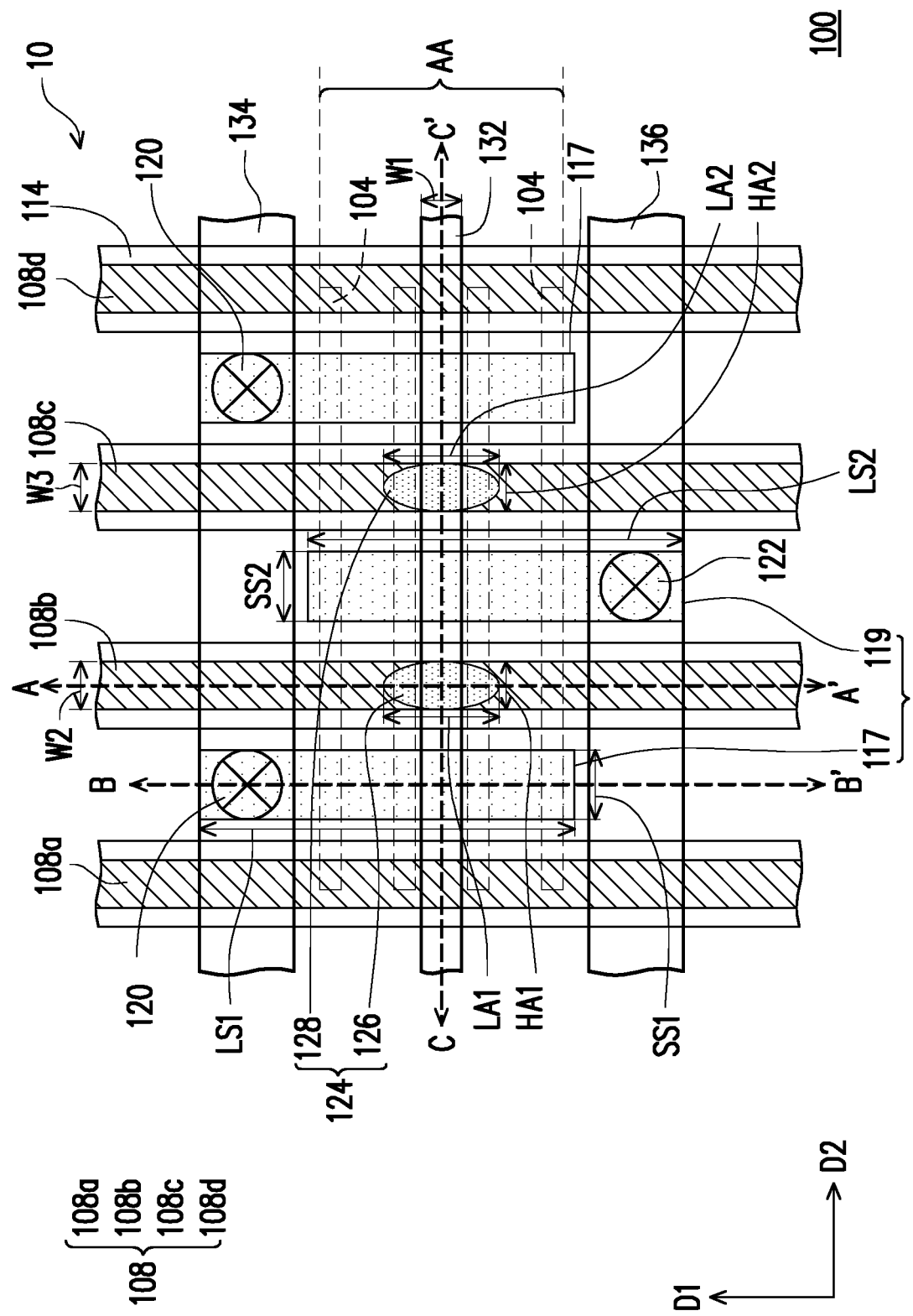
FIG. 1 is a top view of a semiconductor device in accordance with a first embodiment.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a second feature over or on a first feature in the description that follows may include embodiments in which the second and first features are formed in direct contact, and may also include embodiments in which additional features may be formed between the second and first features, such that the second and first features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath", "below", "lower", "on" "above", "upper" and the like, may be used herein for ease of description to describe one element or feature's relationship to another element(s) or feature(s) as illustrated in the FIGS. The spatially relative terms are intended to encompass different orientations of the device in use or operation in addition to the orientation depicted in the FIGS. The apparatus may be otherwise oriented (rotated 90 degrees or at other orientations) and the spatially relative descriptors used herein may likewise be interpreted accordingly.

The fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins.

Figures 2A, 2B:
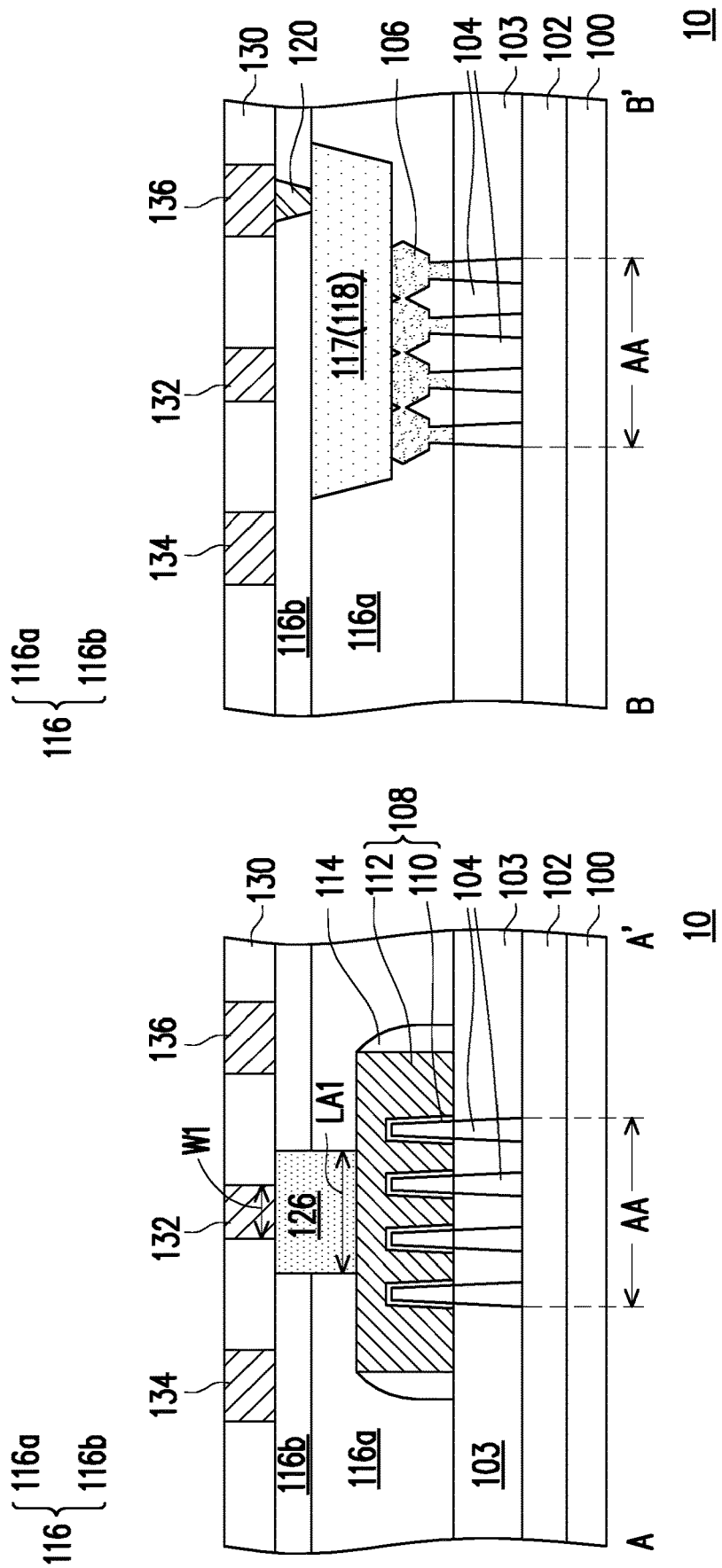
FIG. 2A is a cross-sectional view of line A-A' of FIG. 1.
FIG. 2B is a cross-sectional view of line B-B' of FIG. 1.
Figure 2C:
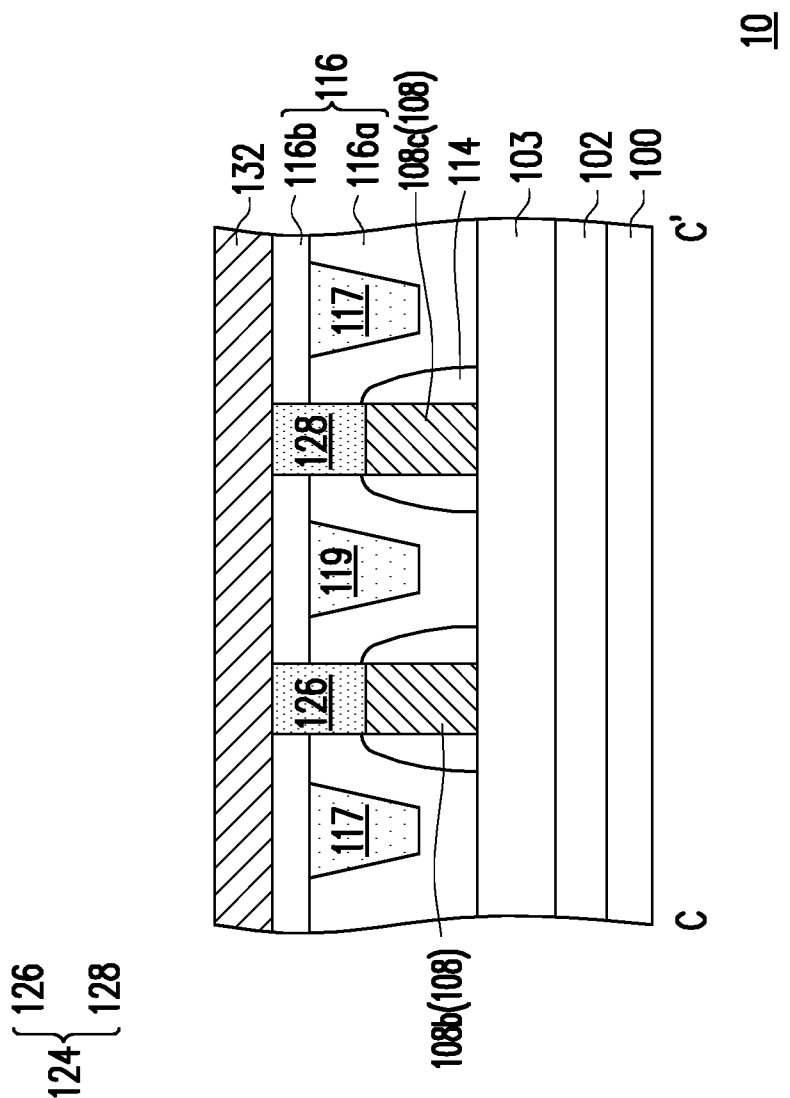
FIG. 2C is a cross-sectional view of line C-C' of FIG. 1.

FIG. 1 is a top view of a semiconductor device in accordance with a first embodiment. FIG. 2A is a cross-sectional view of line A-A' of FIG. 1. FIG. 2B is a cross-sectional view of line B-B' of FIG. 1. FIG. 2C is a cross-sectional view of line C-C' of FIG. 1. In some embodiments, all semiconductor devices discussed in the following embodiments include N-type metal oxide semiconductor (NMOS) FinFETs, P-type metal oxide semiconductor (PMOS) FinFETs, complementary metal oxide semiconductor (CMOS) FinFETs, or a combination thereof. In some alternative embodiments, all semiconductor devices discussed in the following embodiments may include 2D-FinFET, 3D-FinFET, or a combination thereof. Thus, no repeat in the following paragraph.

Referring to FIGS. 1, 2A, 2B, and 2C, a semiconductor device 10 of the first embodiment is provided. In detail, the semiconductor device 10 includes a substrate 100, a well region 102, a plurality of isolation structures 103, a plurality of source and/or drain (S/D) structures 106, a plurality of gate structures 108, a dielectric layer 116, a plurality of contacts 118, two gate vias 124, two source vias 120, a drain via 122, a dielectric layer 130, a first metal layer 132, a second metal layer 134, and a third metal layer 136.

In some embodiments, the substrate 100 may be a semiconductor substrate, such as a bulk semiconductor, a semiconductor-on-insulator (SOI) substrate, or the like, which may be doped (e.g., with a p-type or an n-type dopant) or undoped. The substrate 100 may be a wafer, such as a silicon wafer. Generally, an SOI substrate is a layer of a semiconductor material formed on an insulator layer. The insulator layer may be, for example, a buried oxide (BOX) layer, a silicon oxide layer, or the like. The insulator layer is provided on a substrate, typically a silicon or glass substrate.

Other substrates, such as a multi-layered or gradient substrate may also be used. In some embodiments, the semiconductor material of the substrate 10 may include silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. In some alternative embodiments, the substrate 100 includes bulk-Si, SiP, SiGe, SiC, SiPC, Ge, SOI—Si, SOI—SiGe, III-VI material, or a combination thereof.

The substrate 100 has a plurality of semiconductor fins 104 to define an active region AA. In detail, as shown in FIG. 1, the semiconductor fins 104 are semiconductor strips extending along a second direction D2. In some embodiments, the semiconductor fins 104 may be formed on the substrate 100 by etching trenches in the substrate 100. The etching may be any acceptable etching process, such as a reactive ion etching (RIE) process, neutral beam etching (NBE) process, the like, or a combination thereof. In other embodiments, the etching process may be an anisotropic process. In the case, as shown in FIGS. 2A, 2B, and 2C, the semiconductor fins 104 protrude from a top surface of the substrate 100. In FIG. 1, four semiconductor fins 104 are shown to represent the plurality of semiconductor fins 104, but the disclosure is not limited thereto. In some alternative embodiment, the plurality of semiconductor fins 104 include at least three semiconductor fins, such as three, four, five, six, or more semiconductor fins.

In addition, the substrate 100 may comprise various doped regions, such as a well region 102, depending on design requirements (e.g., p-type substrate or n-type substrate). In some embodiments, the well region 102 may be doped with p-type or n-type dopants. For example, the well region 102 may be doped with p-type dopants, such as boron or $BF_2$; n-type dopants, such as phosphorus or arsenic; and/or combinations thereof. The fabrication includes performing one or more doping processes, such as implantation processes to form the well region 102 in the substrate 100. In some embodiments, a conductive type of the well region 102 is different from a conductive type of the substrate 100, while the conductive type of the well region 102 is the same as a conductive type of the semiconductor fins 104. In other embodiments, as shown in FIGS. 2A, 2B, and 2C, the well region is optional formed between the substrate 100 and the semiconductor fins 104.

In FIGS. 2A, 2B, and 2C, the isolation structures 103 are disposed aside the semiconductor fins 104. In some embodiments, the isolation structures 103 may be an oxide (e.g., silicon oxide), a nitride (e.g., silicon nitride), the like, or a combination thereof, and may be formed by depositing an insulation material in an acceptable deposition process, such as a high density plasma chemical vapor deposition (HDP-CVD), a flowable CVD (FCVD), or the like; planarizing the insulation material in an acceptable planarization process, such as a chemical mechanical polish (CMP), an etch back process, or the like; and recessing the insulation material in an acceptable etching process, such as a dry etching, a wet etching, or a combination thereof. In the case, the semiconductor fins 104 protrude from between adjacent isolation structures 103. That is, top surfaces of the isolation structures 103 are lower than top surfaces of the semiconductor fins 104. Further, the top surfaces of the isolation structures 103 may have a flat surface as illustrated, a convex surface, a concave surface (such as dishing), or a combination thereof. In some alternative embodiments, the isolation structures 103 may be shallow trench isolation (STI) structures.

In FIG. 1, the gate structures 108 are disposed across the semiconductor fins 104 and extends along a first direction D1. In some embodiments, the first direction D1 and the second direction D2 are different. For example, the first direction D1 is perpendicular or orthogonal to the second direction D2. In detail, as shown in FIG. 2A, one of the gate structures 108 includes a gate dielectric layer 110 and a gate electrode 112 over the gate dielectric layer 110. The gate dielectric layer 110 conformally covers surfaces of the semiconductor fins 104 exposed by the isolation structures 103. In some embodiments, the gate dielectric layer 110 may be a high-k dielectric material having a k value greater than about 7, and may include a metal oxide or a silicate of Hf, Al, Zr, La, Mg, Ba, Ti, Pb, or a combination thereof. The formation methods of the gate dielectric layer 110 may include Molecular-Beam Deposition (MBD), ALD, PECVD, or the like. In some alternative embodiments, the gate dielectric layer 110 may include SiON, $Ta_2O_5$, $Al_2O_3$, nitrogen-containing oxide layer, nitrided oxide, metal oxide dielectric material, Hf-containing oxide, Ta-containing oxide, Ti-containing oxide, Zr-containing oxide, Al-containing oxide, La-containing oxide, high k material (k>5) or a combination thereof. In some embodiments, the gate electrode 112 may include polysilicon, a metal-containing material, such as TiN, TaN, TaC, Co, Ru, Al, a combination thereof, or multi-layers thereof. Although a single gate electrode 112 is shown, any number of work function tuning layers may be disposed between the gate dielectric layer 110 and the gate electrode 112. For example, the gate structure 108 may include a multiple material structure selected from a group consisting of polysilicon/SiON structure, metals/high-k dielectric structure, Al/refractory metals/high-k dielectric structure, silicide/high-k dielectric structure, or a combination thereof, from top to bottom.

Further, gate spacers 114 are disposed along sidewalls of the gate structures 108. The gate spacers 114 may be formed by conformally depositing a dielectric material and subsequently anisotropically etching the dielectric material. The dielectric material of the gate spacers 114 may include silicon oxide, silicon nitride, silicon oxynitride, SiCN, the like, or a combination thereof. The formation methods of gate spacers 114 may include forming dielectric material by a deposition such as ALD, PECVD, or the like, and then performing an etch such as an anisotropic etching process.

In FIG. 2B, the S/D structures 106 are disposed over the semiconductor fins 104 at both sides of the gate structures 108. In some embodiments, the S/D structures 106 may be epitaxial structures formed by growing epitaxial layers over exposed surfaces of the semiconductor fins 104. Growing the epitaxy layers on exposed surfaces of the semiconductor fins 104 may include performing a pre-clean process to remove the native oxide on the surface of the semiconductor fins 104. Next, an epitaxy process is performed to grow the epitaxial S/D structures 106 on the surfaces of the semiconductor fins 104. Since the lattice constant of the epitaxial S/D structures 106 is different from the semiconductor fins 104, channel regions of the semiconductor fins 104 are strained or stressed to enable carrier mobility of the device and enhance the device performance. The S/D structures 106 are portions of the semiconductor fins 104 not covered by the gate structures 108, and the channel regions are the portions of the semiconductor fins 104 covered by the gate structures 108. In an embodiment, the S/D structures 106 may be epitaxial structures including SiGe, SiGeC, Ge, Si, or a combination thereof when the semiconductor device 10 is the PMOS FET. In another embodiment, the S/D structures 106 may be epitaxial structures including SiP, SiC, SiPC, Si, or a combination thereof when the semiconductor device 10 is the NMOS FET. The S/D structures 106 may be formed by first etching the semiconductor fins 104 to form recesses (not shown), and then depositing a crystalline semiconductor material in the recess by a selective epitaxial growth (SEG) process that may fill the recess and even extend beyond the original surface of the semiconductor fins 104 to form a raised source/drain structure. In some cases, the S/D structures 106 may have facets or may have irregular shapes. The SEG process may use any suitable epitaxial growth method such as, vapor phase epitaxy (VPE), metal-organic CVD (MOCVD), molecular beam epitaxy (MBE), and liquid phase epitaxy (LPE). In some cases, S/D structures 106 may be implanted with dopants using patterned photoresist masks. In some cases, the S/D structures 106 may be in situ doped during epitaxial growth.

In FIGS. 2A, 2B, and 2C, the dielectric layer 116 (also referred to as an interlayer dielectric (ILD) layer) is disposed over the semiconductor fins 104 and the S/D structures 106. The dielectric layer 116 may be deposited by any suitable method, such as CVD, plasma-enhanced CVD (PECVD), or FCVD. The dielectric material may include phospho-silicate glass (PSG), borosilicate glass (BSG), boron-doped phospho-silicate glass (BPSG), undoped silicate glass (USG), the like, or a combination thereof. In some embodiments, the dielectric layer 116 may include a single layer dielectric material or a multi-layer dielectric material. In this embodiment, the dielectric layer 116 includes dielectric layer 116*a* and dielectric layer 116*b* on the dielectric layer 116*a*. The dielectric layer 116*a* and the dielectric layer 116*b* may have the same material or different materials. In other some embodiments, a contact etching stop layer (CESL), not illustrated, is disposed between the dielectric layer 116*a* and the S/D structures 106 and/or between the dielectric layer 116*a* and gate electrode 112, and between the dielectric layer 116*a* and the gate spacers 114.

In FIG. 2A and FIG. 2B, the dielectric layer 130 (also referred to as an inter-metal dielectric (IMD) layer) is formed over the dielectric layer 116. In some embodiments, the dielectric layer 130 may be formed after the source vias 120, the drain via 122 and the gate vias 124 are formed. The dielectric layer 130 may include a single layer dielectric material or a multi-layer dielectric material, and may be deposited by any suitable method, such as CVD, plasma-enhanced CVD (PECVD), or FCVD. The dielectric material may include phospho-silicate glass (PSG), borosilicate glass (BSG), boron-doped phospho-silicate glass (BPSG), undoped silicate glass (USG), the like, or a combination thereof. In some alternative embodiments, the dielectric layers 130 and 116 may have a same material or different materials.

In FIG. 2A and FIG. 2B, the first metal layer 132, the second metal layer 134, and the third metal layer 136 are disposed in the dielectric layer 130. In detail, as shown in FIG. 1, the first metal layer 132, the second metal layer 134, and the third metal layer 136 extend along the second direction D2 and are disposed across the gate structures 108. The first metal layer 132 is disposed between the second metal layer 134 and the third metal layer 136, and separated from the second metal layer 134 and the third metal layer 136. In some embodiments, the first metal layer 132, the second metal layer 134, and the third metal layer 136 are referred to as metal one (M1). That is, the first metal layer 132, the second metal layer 134, and the third metal layer 136 are substantially at a same level. Herein, when elements are described as "at substantially the same level", the elements are formed at substantially the same height in the same layer, or having the same positions embedded by the same layer. In some embodiments, the elements at substantially the same level are formed from the same material(s) with the same process step(s). In some embodiments, the tops of the elements at substantially the same level are substantially coplanar. For example, as shown in FIG. 2A and FIG. 2B, top surfaces of the first metal layer 132, the second metal layer 134, and the third metal layer 136 are substantially coplanar and/or the first metal layer 132, the second metal layer 134, and the third metal layer 136 have the same height. In other embodiments, the first metal layer 132, the second metal layer 134, and the third metal layer 136 may include a metal material, such as aluminum, copper, nickel, gold, silver, tungsten, or a combination thereof and formed by an electro-chemical plating process, CVD, PVD or the like. In some embodiments, the first metal layer 132, the second metal layer 134, and the third metal layer 136 are formed before the dielectric layer 130 is formed. The first metal layer 132, the second metal layer 134, and the third metal layer 136 may be formed by forming a metal material on the dielectric layer 116*b*, and the patterning the metal material by a photolithography process and an etching process such as anisotropic process. In other some embodiments, the first metal layer 132, the second metal layer 134, and the third metal layer 136 are formed after the dielectric layer 130 is formed. The first metal layer 132, the second metal layer 134, and the third metal layer 136 may be formed by the following processes. The dielectric layer 130 is patterned by a photolithography process and an etching process such as anisotropic process to form metal trenches in the dielectric layer 130. A metal material is then formed on the dielectric layer 130 and filled in the metal trenches. The metal material is then planarized in an acceptable planarization process, such as a chemical mechanical polish (CMP), an etch back process, or the like to remove the metal material over the dielectric layer 130.

In FIGS. 1, 2B, and 2C, the contacts 118 are formed in the dielectric layer 116 (i.e. dielectric layer 116*a*) between adjacent two gate structures 118. Specifically, the contacts 118 may include two first contacts 117 and a second contact 119. As shown in FIG. 1, one of the first contacts 117 is disposed between the first gate structure 108*a* and the second gate structure 108*b*, and across the semiconductor fins 104. Another of the first contacts 117 is disposed between the third gate structure 108*c* and the fourth gate structure 108*d*, and across the semiconductor fins 104. The second contact 119 is disposed between the second gate structure 108*b* and the third gate structure 108*c*, and across the semiconductor fins 104. As shown in FIG. 2B, the contacts 118 are disposed over the S/D structures 106 and physically and electrically coupled to the S/D structures 106. In some embodiments, the contacts 118 includes a liner, such as a diffusion barrier layer, an adhesion layer, or the like, and a conductive material. The liner may include Ti, TiN, Ta, TaN, the like, or a combination thereof. The conductive material may be Ti, TiN, TaN, Co, Ru, Pt, W, Al, Cu, or a combination thereof. The contacts 118 may be formed by an electro-chemical plating process, CVD, PVD or the like. The formation of the contacts 118 may include the following steps. The dielectric layer 116*a* is patterned to form contact trenches (not shown) through a photolithography process and an etching process such as anisotropic process. The conductive material is formed on the dielectric layer 116*a* and filled in the contact trenches. The conductive material is then planarized in an acceptable planarization process, such as a chemical mechanical polish (CMP), an etch back process, or the like to remove the conductive material over the dielectric layer 116a. Therefore, in some embodiments, the contacts 118 (including the first contacts 117 and the second contact 119) may be substantially at a same level.

From the top view of FIG. 1, each of the first contacts 117 is a rectangular contact having a long side LS1 and a short side SS1. The long side LS1 extends from the second metal layer 134 and across the active region AA. In some embodiments, a ratio of the long side LS1 to the short side SS1 is greater than 2. In the cross-sectional view of FIG. 2B, each of the first contacts 117 is a slot shape or a trapezoidal shape. That is, a top area of each of the first contacts 117 is greater than a bottom area of each of the first contacts 117. Similarly, the second contacts 119 is also a rectangular contact having a long side LS2 and a short side SS2. The long side LS1 extends from the third metal layer 136 and across the active region AA. In some embodiments, a ration of the long side LS2 to the short side SS2 is greater than 2. The second contacts 119 may be a slot shape or a trapezoidal shape. That is, a top area of each of the second contacts 119 is greater than a bottom area of the second contacts 119.

In FIG. 2B, the contacts 118 are physically and electrically connected to the S/D structures 106. In addition, a plurality of silicide layers (not shown) may be formed respectively between the contacts 118 and the S/D structures 106 to reduce a resistance between the contacts 118 and the S/D structures 106. The silicide layer may include $TiSi_2$, NiSi, PtSi, $CoSi_2$, or combination thereof.

In FIGS. 1 and 2B, the source vias 120 and the drain via 122 are formed in the dielectric layer 116b. In some embodiments, the source vias 120 and the drain via 122 are formed at two sides of the active region AA. In detail, the source vias 120 and the rain via 122 are formed different sides of the active region AA, but the disclosure is not limited thereto. The source vias 120 are disposed between and electrically connected the second metal layer 134 and the first contacts 117 respectively. The drain via 122 is disposed between and electrically connected the third metal layer 136 and the second contact 119. In some embodiments, each of the source vias 120 and the drain via 122 may include a liner, such as a diffusion barrier layer, an adhesion layer, or the like, and a conductive material. The liner may include Ti, TiN, Ta, TaN, the like, or a combination thereof. The conductive material may be Ti, TiN, TaN, Co, Ru, Pt, W, Al, Cu, or a combination thereof. The source vias 120 and the drain via 122 may be formed by an electro-chemical plating process, CVD, PVD or the like. The formation of the source vias 120 and drain via 122 may include the following steps. The dielectric layer 116b is patterned to form via openings (not shown) through a photolithography process and an etching process such as anisotropic process. The conductive material is filled in the via openings and on the dielectric layer 116b. The conductive material is then planarized in an acceptable planarization process, such as a chemical mechanical polish (CMP), an etch back process, or the like to remove the conductive material over the dielectric layer 116b. Therefore, in some embodiments, the source vias 120 and the drain via 122 may be substantially at a same level.

In FIGS. 1, 2A, and 2C, the gate vias 124 are formed in the dielectric layers 116b and 116a. The gate vias 124 are respectively disposed between the gate structures 108 and the first metal layer 132. In detail, as shown in FIG. 1, the gate vias 124 may include a first gate via 126 and a second gate via 128. The gate structures 108 may include a first gate structure 108a, a second gate structure 108b, a third gate structure 108c, and a fourth gate structure 108d. The first gate via 126 is disposed between and electrically connected the second gate structure 108b and the first metal layer 132, while the second gate via 128 is disposed between and electrically connected the third gate structure 108c and the first metal layer 132. Although only two gate vias 124 are illustrated in FIG. 1, the number of the gate vias 124 is not limited thereto. In general, the gate vias 124 are disposed between the gate structures 108 and the first metal layer 132, which means the number of the gate vias 124 is able be adjusted by the number of the gate structures 108.

In some embodiments, the first gate via 126 has a longitudinal axis LA1 and a horizontal axis HA1 perpendicular to each other. The longitudinal axis LA1 extends along the first direction D1 and is across the first metal layer 132. A length of the longitudinal axis LA1 of the first gate via 126 is greater than a width W1 of the first metal layer 132. A length of the horizontal axis HA1 is less than or equal to a width W2 of the second gate structure 108b. Namely, the horizontal axis HA1 is within a range of the second gate structure 108b. Similarly, the second gate via 128 has a longitudinal axis LA2 and a horizontal axis HA2 perpendicular to each other. The longitudinal axis LA2 extends along the first direction D1 and is across the first metal layer 132. A length of the longitudinal axis LA2 of the second gate via 128 is greater than a width W1 of the first metal layer 132. A length of the horizontal axis HA2 is less than or equal to a width W3 of the third gate structure 108c. Namely, the horizontal axis HA2 is within a range of the third gate structure 108c.

In an embodiment, a ratio of the length of the longitudinal axis LA1/LA2 of the gate via 126/128 to the width W1 of the first metal layer 132 is greater than 1.3. In another embodiment, the longitudinal axis LA1/LA2 of the gate via 126/128 is included within a range of the active region AA. In some alternative embodiments, the length of the longitudinal axis LA1 or the horizontal axis HA1 of the first gate via 126 may the same as or different from the length of the longitudinal axis LA2 or the horizontal axis HA2 of the second gate via 128.

In FIG. 1 and FIG. 2A, the length of the longitudinal axis LA1/LA2 of the gate via 126/128 is greater than the width W1 of the first metal layer 132. In the case, a contact area between the gate via 126/128 and the gate structure 108b/108c increases, so as to decrease a gate resistance between the gate via 126/128 and the gate structure 108b/108c. Therefore, a RC delay of the semiconductor device 10 is improved, thereby enhancing a performance of the semiconductor device 10 and achieving high speed circuit applications. The layout illustrated in FIG. 1 to reduce the gate resistance is suitable for driver circuit, high frequency analog circuit, and SerDes (Serializer/Deserialize) circuit speed improvement. In an embodiment, the semiconductor device 10 may be a high speed or high driver current transistor. In another embodiment, the semiconductor device 10 may be used in SerDes circuit.

In some embodiments, the gate vias 124 includes a liner, such as a diffusion bather layer, an adhesion layer, or the like, and a conductive material. The liner may include Ti, TiN, Ta, TaN, the like, or a combination thereof. The conductive material may be Ti, TiN, TaN, Co, Ru, Pt, W, Al, Cu, or a combination thereof. The gate vias 124 may be formed by an electro-chemical plating process, CVD, PVD or the like. The formation of the gate vias 124 may include the following steps. The dielectric layers 116b and 116a are patterned to form via trenches (not shown) through a photolithography process and an etching process such as anisotropic process. The conductive material is formed to fill in the via trenches and on the dielectric layer 116b. The conductive material is planarized in an acceptable planarization process, such as a chemical mechanical polish (CMP), an etch back process, or the like to remove the conductive material over the dielectric layer 116b. Therefore, in some embodiments, the gate vias 124 (including the first gate via 126 and the second gate via 128) may be substantially at a same level.

It should be noted that the first gate structure 108a, the second gate structure 108b, the third gate structure 108c, and the fourth gate structure 108d are electrically connected together by the gate vias 124 and other gate vias (not shown) over the first gate structure 108a and the fourth gate structure 108d. That is, the first gate structure 108a, the second gate structure 108b, the third gate structure 108c, and the fourth gate structure 108d share the same gate line, e.g., the first metal layer 132. In the case, the first metal layer 132 is referred to as a common gate. In some embodiments, the first gate structure 108a, the second gate structure 108b, the third gate structure 108c, and the fourth gate structure 108d are connected in parallel. The source vias 120 are electrically connected to each other by the second metal layer 134. That is, the source vias 120 share a same source line, e.g., the second metal layer 134. In the case, the second metal layer 134 is referred to as a common source. The drain via 122 may include a plurality of drain vias electrically connected to each other by the third metal layer 136. That is, the drain vias share a same drain line, e.g., the third metal layer 136. In the case, the third metal layer 136 is referred to as a common drain.

Figure 3:
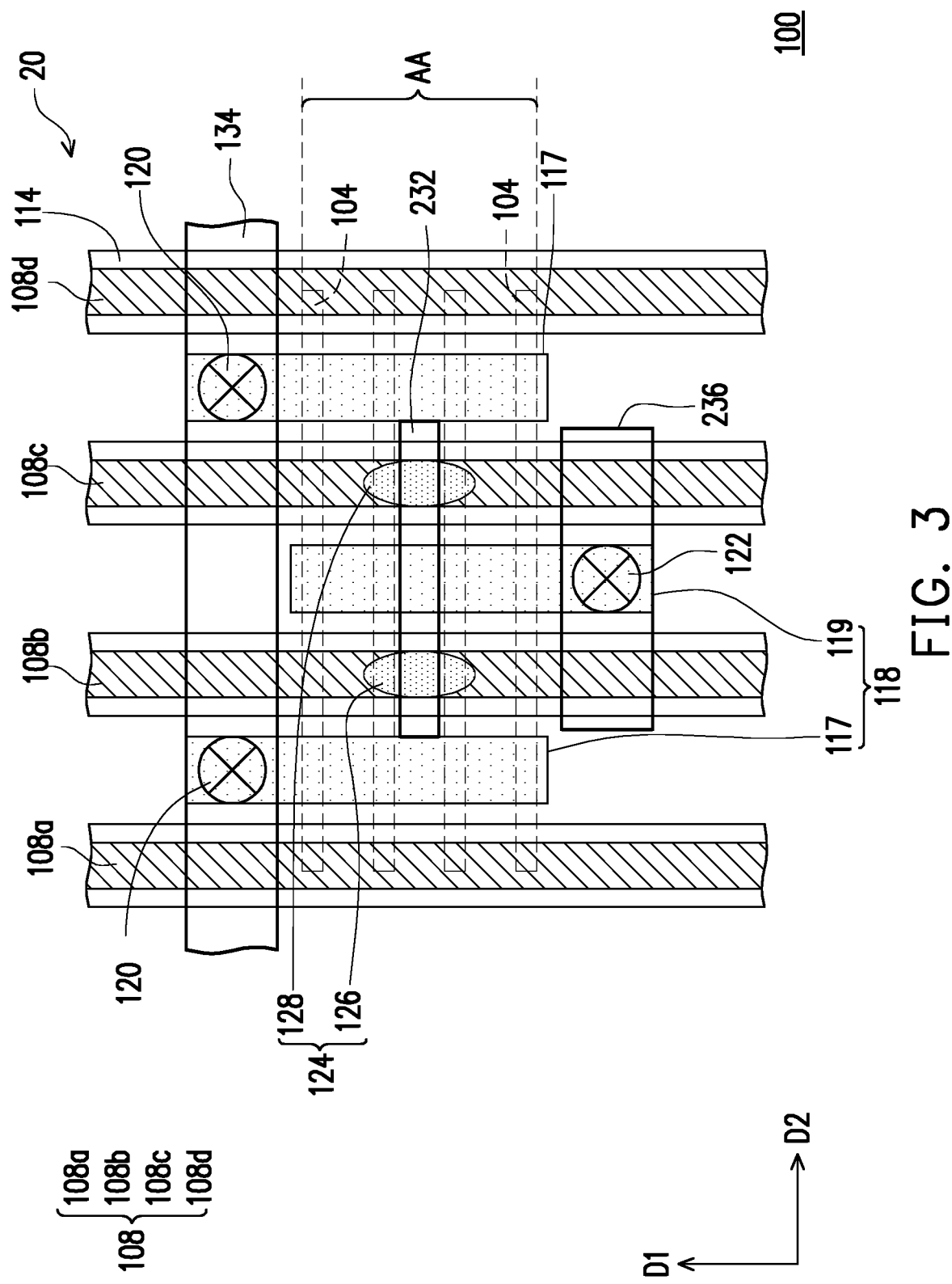
FIG. 3 is a top view of a semiconductor device in accordance with a second embodiment.

FIG. 3 is a top view of a semiconductor device in accordance with a second embodiment.

Referring to FIG. 3, a semiconductor device 20 of the second embodiment is similar to the semiconductor device 10 of the first embodiment. Since the materials and arrangements of the similar components are described in the above embodiments. Thus, details thereof are omitted here. A difference therebetween lies in that a length of the first metal layer 232 of the semiconductor device 20 is less than a length of the first metal layer 132 of the semiconductor device 10. That is, the first metal layer 132 illustrated in FIG. 1 is across the four gate structures 108 (e.g. 108a, 108b, 108c and 108d), while the first metal layer 232 illustrated in FIG. 3 is only across the two gate structures 108 (e.g., the first and second gate structures 108b and 108c). In addition, a length of the third metal layer 236 of the semiconductor device 20 is less than a length of the third metal layer 136 of the semiconductor device 10 (shown in FIG. 1). As shown in FIG. 3, the third metal layer 236 is only across the two gate structures 108 (e.g., the first and second gate structures 108b and 108c).

Figure 4A:
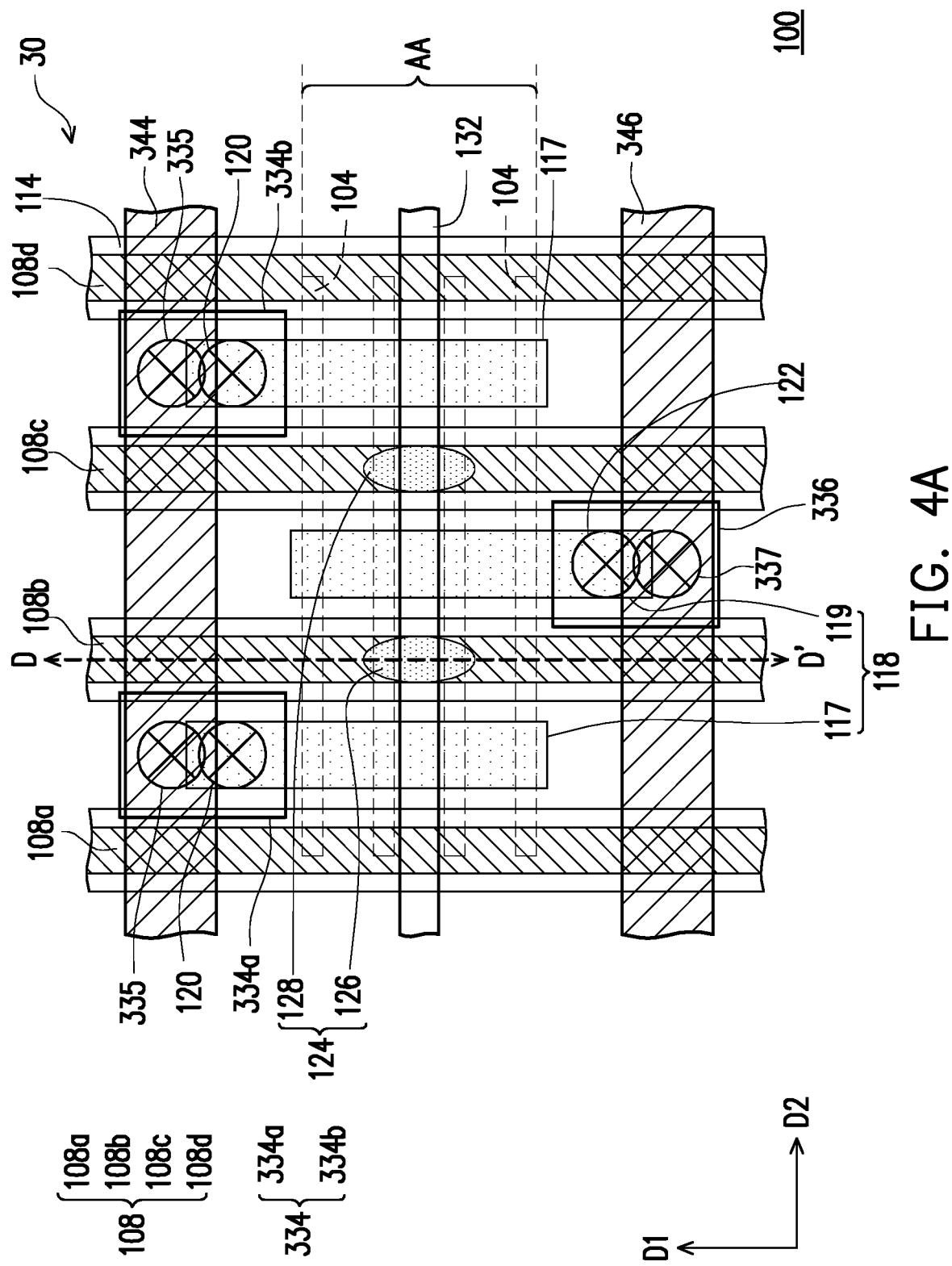
FIG. 4A is a top view of a semiconductor device in accordance with a third embodiment.
Figure 4B:
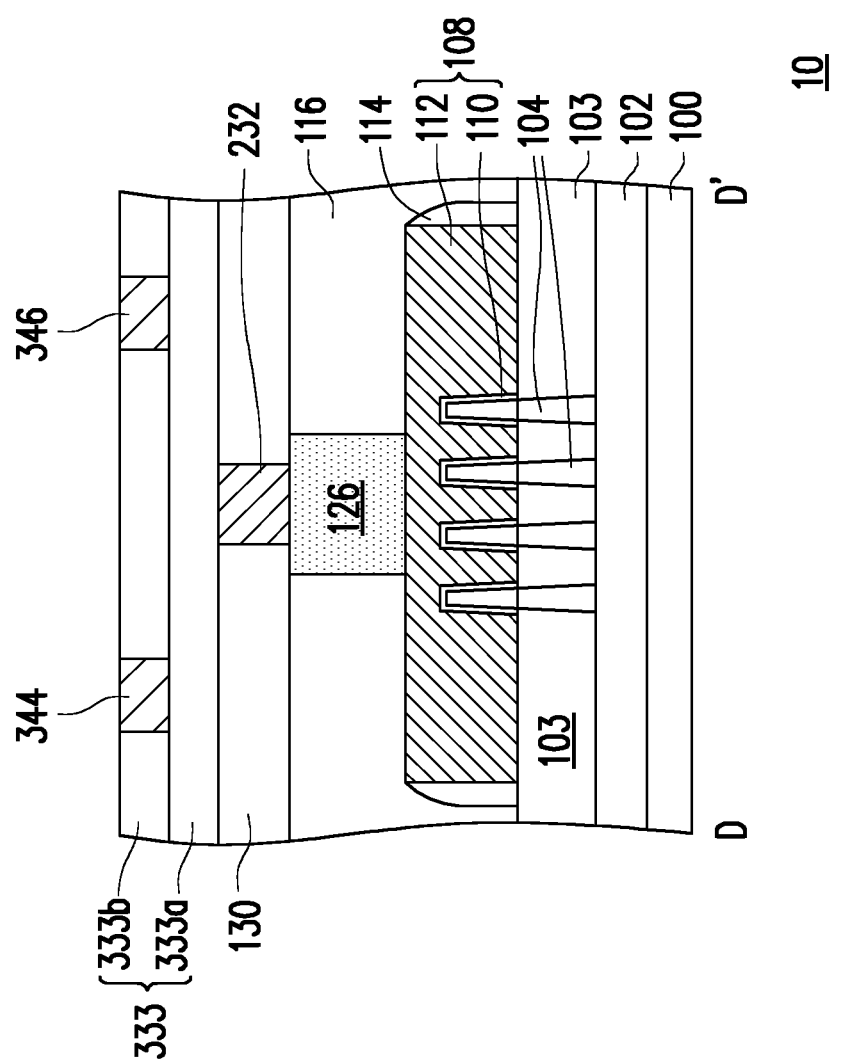
FIG. 4B is a cross-sectional view of line D-D' of FIG. 4A.

FIG. 4A is a top view of a semiconductor device in accordance with a third embodiment. FIG. 4B is a cross-sectional view of line D-D' of FIG. 4A.

Referring to FIG. 4A and FIG. 4B, a semiconductor device 30 of the third embodiment is similar to the semiconductor device 10 of the first embodiment. Since the materials and arrangements of the similar components are described in the above embodiments. Thus, details thereof are omitted here. A difference therebetween lies in that the semiconductor device 30 includes a second metal layers 334, a third metal layer 336, a fourth metal layer 344, two first vias 335, a fifth metal layer 346, a second via 337 and a dielectric layer 333.

In detail, the second metal layer 134 (shown in FIG. 1) is replaced by the second metal layers 334. The second metal layers 334 includes two second metal layers 334a and 334b separated from each other. The second metal layers 334a is disposed between adjacent first gate structure 108a and second gate structure 108b, and separated from the first metal layer 132. The second metal layers 334b is disposed between adjacent the third gate structure 108c and the fourth gate structure 108d, and separated from the first metal layer 132. In addition, the third metal layer 136 (shown in FIG. 1) is replaced by the third metal layer 336. The third metal layer 336 is disposed between adjacent second gate structure 108b and third gate structure 108c, and separated from the first metal layer 132.

The dielectric layer 333 is formed on the dielectric layer 130, the first metal layer 132, the second metal layers 334a and 334b, and the third metal layer 336. The dielectric layer 333 may be deposited by any suitable method, such as CVD, plasma-enhanced CVD (PECVD), or FCVD. The dielectric material may include phospho-silicate glass (PSG), boro-silicate glass (BSG), boron-doped phospho-silicate glass (BPSG), undoped silicate glass (USG), the like, or a combination thereof. In some embodiments, the dielectric layer 333 and 130 may have a same material or different materials. The dielectric layer 333 may include a single layer dielectric material or a multi-layer dielectric material. In some embodiments, the dielectric layer 333 includes a dielectric layer 333a on the dielectric layer 130 and a dielectric layer 333b on the dielectric layer 333a.

The fourth metal layer 344 and the fifth metal layer 346 are located in the dielectric layer 333b. The fourth metal layer 344 and the fifth metal layer 346 are disposed over the second metal layers 334a and 334b and the third metal layer 336. Further, the fourth metal layer 344 and the fifth metal layer 346 are across the gate structures 108 (i.e. 108a, 108b, 108c and 108d). The fourth metal layer 344 and the fifth metal layer 346 may include a metal material, such as aluminum, copper, nickel, gold, silver, tungsten, or a combination thereof and formed by an electro-chemical plating process, CVD, PVD or the like. The formation of the fourth metal layer 344 and the fifth metal layer 346 may be similar to the first metal layer 132, the second metal layer 134, and the third metal layer 136. The fourth metal layer 344 and the fifth metal layer 346 may be formed before or after the dielectric layer 333b is formed.

The first vias 335a and 335b and the second via 337 are formed in the dielectric layer 333a. One of the first via 335a is disposed between and electrically connected the fourth metal layer 344 and the second metal layer 334a, and another one of the first via 335b is disposed between and electrically connected the fourth metal layer 344 and the second metal layer 334b. The second via 337 is disposed between and electrically connected the fifth metal layer 346 and the third metal layer 336. In some embodiments, each of the first vias 335a and 335b and the second via 337 includes a liner, such as a diffusion barrier layer, an adhesion layer, or the like, and a conductive material. The liner may include Ti, TiN, Ta, TaN, the like, or a combination thereof. The conductive material may be Ti, TiN, TaN, Co, Ru, Pt, W, Al, Cu, or a combination thereof. The first vias 335a and 335b and the second via 337 may be formed by an electro-chemical plating process, CVD, PVD or the like. The formation of the first vias 335a and 335b and the second via 337 may include the following steps. The dielectric layer 333a is patterned to form via openings (not shown) through a photolithography process and an etching process such as anisotropic process. The conductive material is formed on the dielectric layer 333a and filled in the via openings. The conductive material is then planarized in an acceptable planarization process, such as a chemical mechanical polish (CMP), an etch back process, or the like to remove the conductive material over the dielectric layer 333a.

In some embodiments, the first vias 335a and 335b and the second via 337 may be formed first, and then the fourth metal layer 344 and the fifth metal layer 346 are formed. In other some embodiments, the first vias 335a and 335b, the second via 337, the fourth metal layer 344 and the fifth metal layer 346 may be formed at same process such as a dual damascene process. In other words, the dielectric layer 333 is patterned to form metal trenches (not shown) in the dielectric layer 333b and via openings (not shown) are formed in the dielectric layer 333a. Thereafter, a conductive material is formed on the dielectric layer 333b and filled in the metal trenches and the via openings. The conductive material is then planarized in an acceptable planarization process, such as a chemical mechanical polish (CMP), an etch back process, or the like to remove the conductive material over the dielectric layer 333b.

In some embodiments, the first metal layer 132, the second metal layers 334a and 334b, and the third metal layer 336 are referred to as metal one (M1). That is, the first metal layer 132, the second metal layers 334a and 334b, and the third metal layer 336 are substantially at the same level. In some alternative embodiments, the fourth metal layer 344 and the fifth metal layer 346 are referred to as metal two (M2). That is, the fourth metal layer 344 and the fifth metal layer 346 are substantially at the same level. The M2 is higher than the M1. Further, as shown in FIG. 4B, the first metal layer 132, fourth metal layer 344, and the fifth metal layer 346 are disposed in a staggered arrangement. In the case, a capacitance between the M1 and M2 decreases, so that a RC delay of the semiconductor device 30 is improved, thereby enhancing a performance of the semiconductor device 30.

Figure 5:
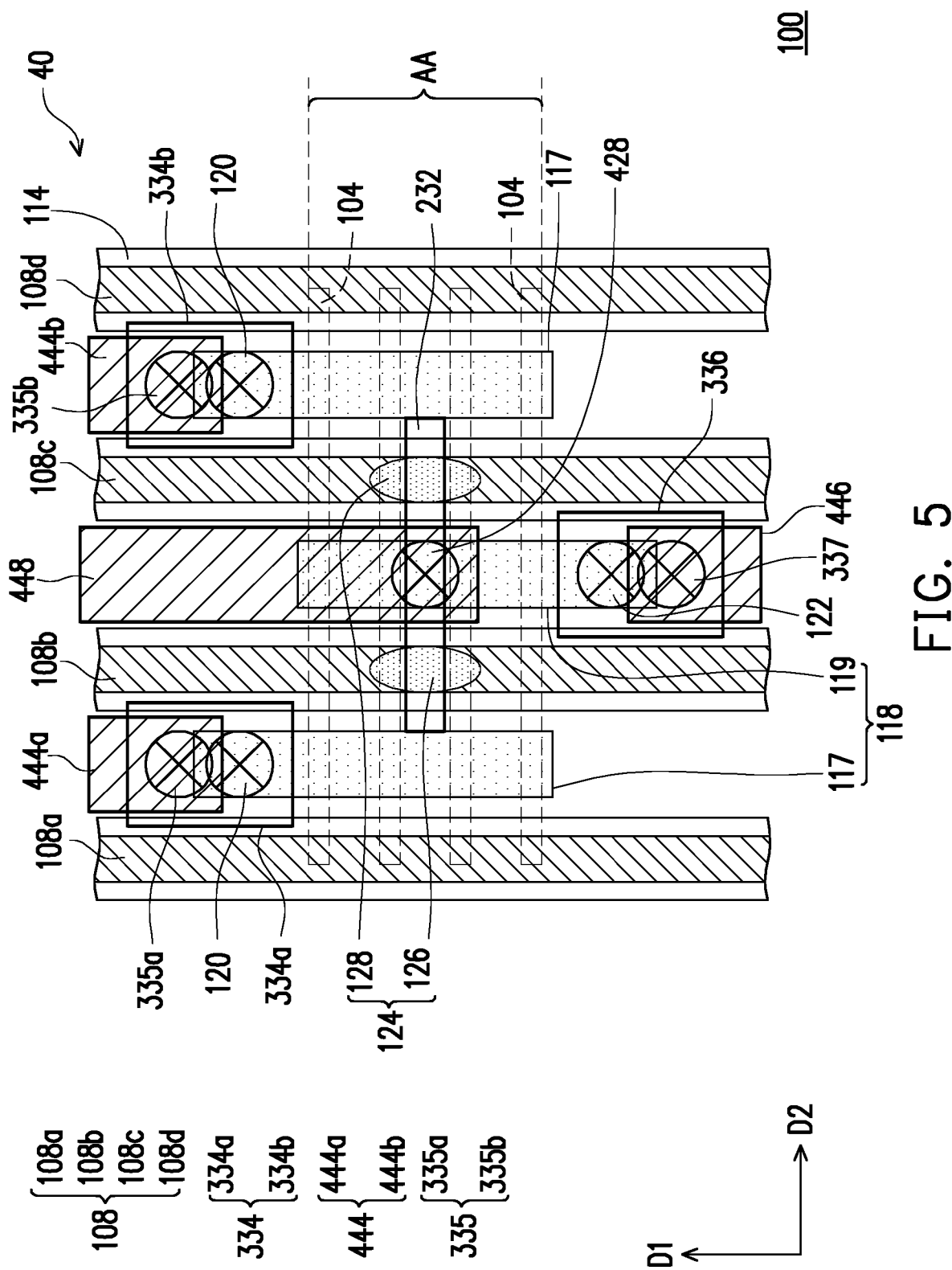
FIG. 5 is a top view of a semiconductor device in accordance with a fourth embodiment.

FIG. 5 is a top view of a semiconductor device in accordance with a fourth embodiment.

Referring to FIG. 5, a semiconductor device 40 of the fourth embodiment is similar to the semiconductor device 30 of the third embodiment. Since the materials and arrangements of the similar components are described in the above embodiments. Thus, details thereof are omitted here. A difference therebetween lies in that the semiconductor device 40 includes fourth metal layers 444, a fifth metal layer 446, a sixth metal layer 448, and a third via 428.

In detail, fourth metal layer 344 and the fifth metal layer 346 are replaced by fourth metal layers 444 and the fifth metal layer 446, respectively. The fourth metal layers 444 includes two fourth metal layers 444a and 444b separated from each other. The fourth metal layers 444a is disposed over the second metal layers 334a, and electrically connected to the second metal layers 334a by the first via 335a. The fourth metal layers 444b is disposed over the second metal layers 334b, and electrically connected to the second metal layers 334b by the first via 335b. The fifth metal layer 446 is disposed over the third metal layer 336, and electrically connected to the third metal layer 336 by the second via 337.

In addition, the sixth metal layer 448 is disposed over the first metal layer 232. As shown in FIG. 5, the sixth metal layer 448 is disposed between adjacent second gate structure 108b and third gate structure 108c, and extends along the first direction D1. The third via 428 is disposed between and electrically connected the sixth metal layer 448 and the first metal layer 232.

In some embodiments, the first metal layer 232, the second metal layers 334a and 334b, and the third metal layer 336 are referred to as metal one (M1). That is, the first metal layer 232, the second metal layers 334a and 334b, and the third metal layer 336 are substantially at the same level. In some alternative embodiments, the fourth metal layers 444a and 444b, the fifth metal layer 446, and the sixth metal layer 448 are referred to as metal two (M2). That is, the fourth metal layers 444a and 444b, the fifth metal layer 446, and the sixth metal layer 448 are substantially at the same level. The first vias 335a and 335b, the second via 337 and the third via 428 are disposed between the M2 and the M1.

Figure 6A:
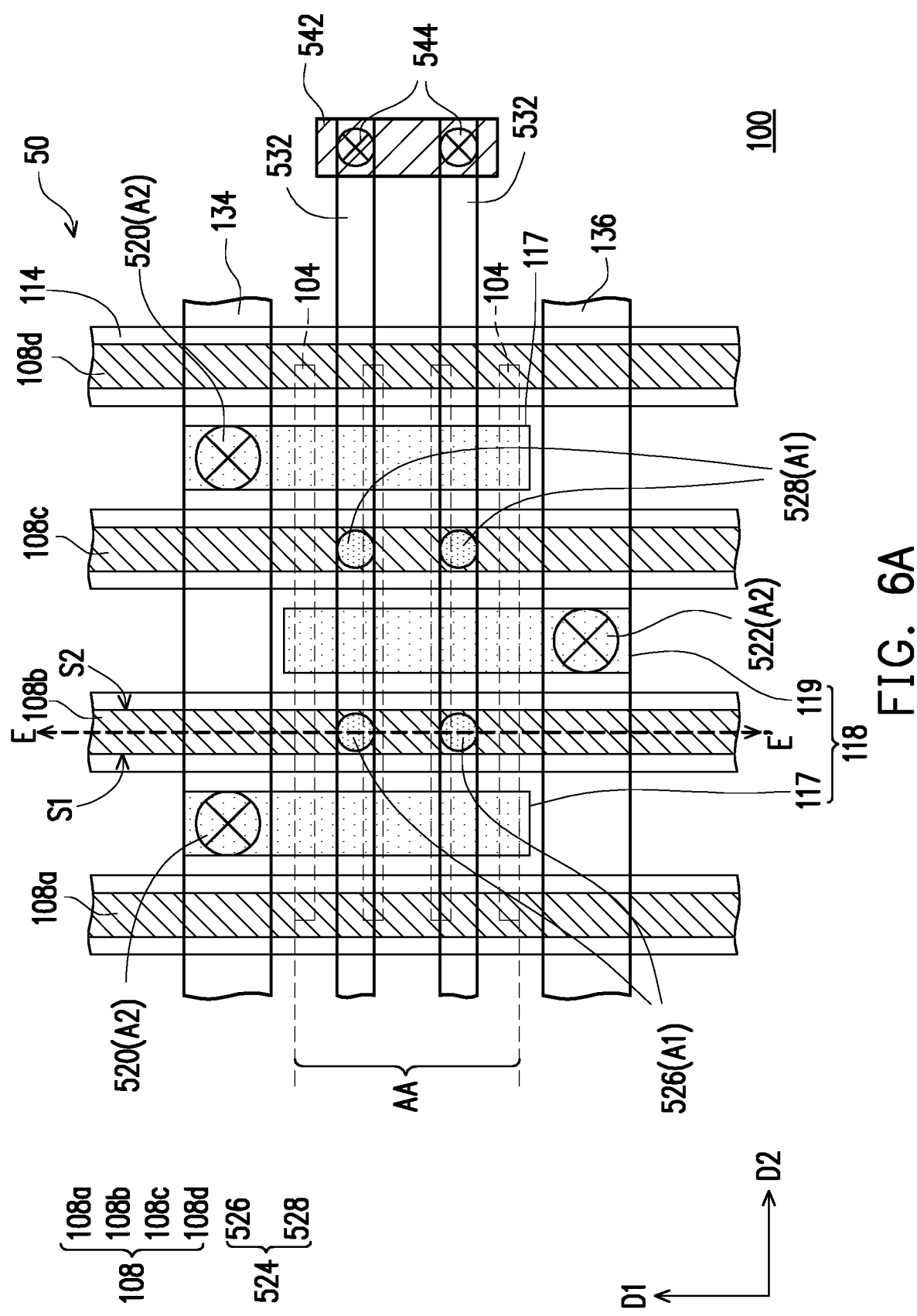
FIG. 6A is a top view of a semiconductor device in accordance with a fifth embodiment.
Figure 6B:
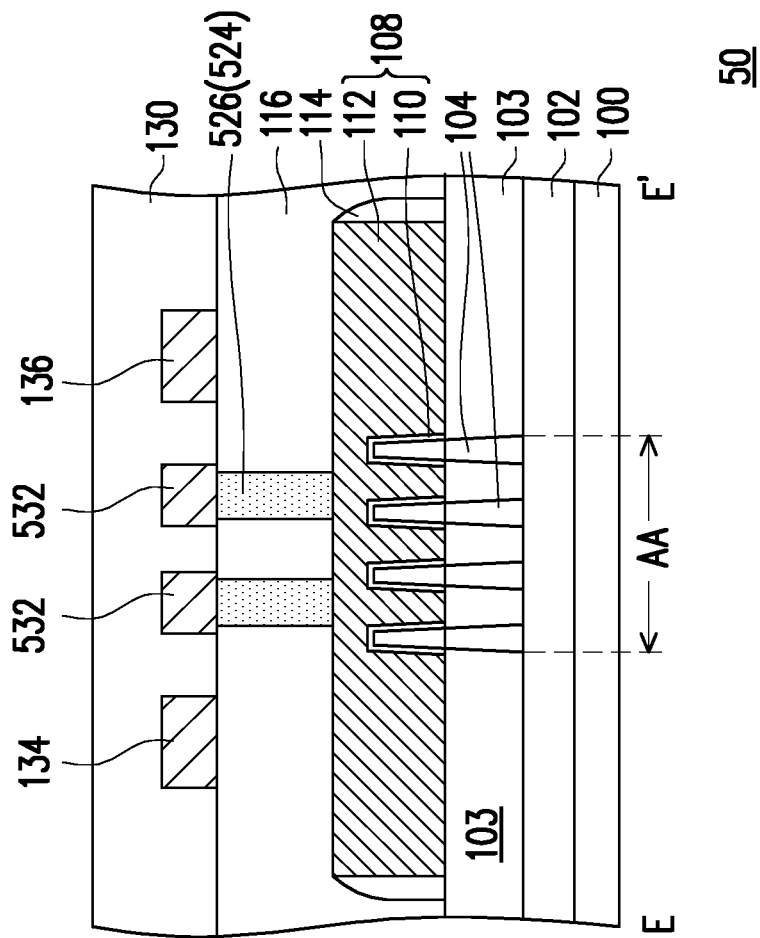
FIG. 6B is a cross-sectional view of line E-E' of FIG. 6A.

FIG. 6A is a top view of a semiconductor device in accordance with a fifth embodiment. FIG. 6B is a cross-sectional view of line E-E' of FIG. 6A.

Referring to FIG. 6A and FIG. 6B, a semiconductor device 50 of the fifth embodiment is similar to the semiconductor device 10 of the first embodiment. Since the materials and arrangements of the similar components are described in the above embodiments. Thus, details thereof are omitted here. A difference therebetween lies in that the semiconductor device 50 includes two source vias 520, a drain via 522, a plurality of gate vias 524, and two first metal layers 532.

In detail, the source vias 520 is disposed over the first contacts 117, and the drain via 522 is disposed over the second contacts 119. One of the source vias 520 is disposed at one side S1 of the second gate structure 108b, and the drain via 522 is disposed at another side S2 of the second gate structure 108b. The one side S1 is opposite to the another side S1. In some embodiments, a source is disposed on the semiconductor fins 104 at the one side S1 of the gate structure 108b and the source vias 520 is disposed over the source. In some alternative embodiments, a drain is disposed on the semiconductor fins 104 at the another side S2 of the gate structure 108b and the drain via 522 is disposed over the drain. On the other hand, another one of the source vias 520 and the drain via 522 are disposed different sides of the second gate structure 108c.

The first metal layer 132 (FIG. 1) is replaced by two first metal layers 532. Only two first metal layers 532 are illustrated in FIG. 6A, but the disclosure is not limited thereto. The first metal layers 532 extends along the second direction D2 and across the gate structures 108 (e.g., 108a, 108b, 108c and 108d). The first metal layers 532 (e.g., MD are electrically and physically coupled to each other by vias 544 and metal layer 542 (e.g., M2). In some embodiments, the first metal layers 532 are connected in parallel. Some of the gate vias 524 are disposed over the gate structures 108 within the active region AA. Specifically, the gate vias 524 includes one group of two gate vias 526 and another group of two gate vias 528. The one group of two gate vias 526 is disposed between and electrically connected the second gate structure 108b and the first metal layers 532. The another group of two gate vias 528 is disposed between and electrically connected the third gate structure 108c and the first metal layers 532. Only two gate vias 526/528 directly over the single gate structure 108b/108c are illustrated in FIG. 6A, but the disclosure is not limited thereto. In some alternative embodiment, the plurality of gate vias 524 include at least two gate vias over the corresponding gate structure, such as two, three, four, five, six, or more gate vias.

In some embodiments, as shown in FIG. 6A, a horizontal cross-sectional area of one of the gate vias 524 is represented as A1, a horizontal cross-sectional area A2 of one of the source vias 520 or the drain via 522 is represented as A2, wherein A2 is greater than A1. In some alternative embodiments, a ratio of the horizontal cross-sectional area of one of the source vias 520 or the drain via 522 to the horizontal cross-sectional area of one of the gate vias 524 is greater than 1.4 (i.e., A2/A1>1.4). In other embodiments, the semiconductor device 50 may be used in static random access memory (SRAM) macro word-line driver circuit.

Figure 7A:
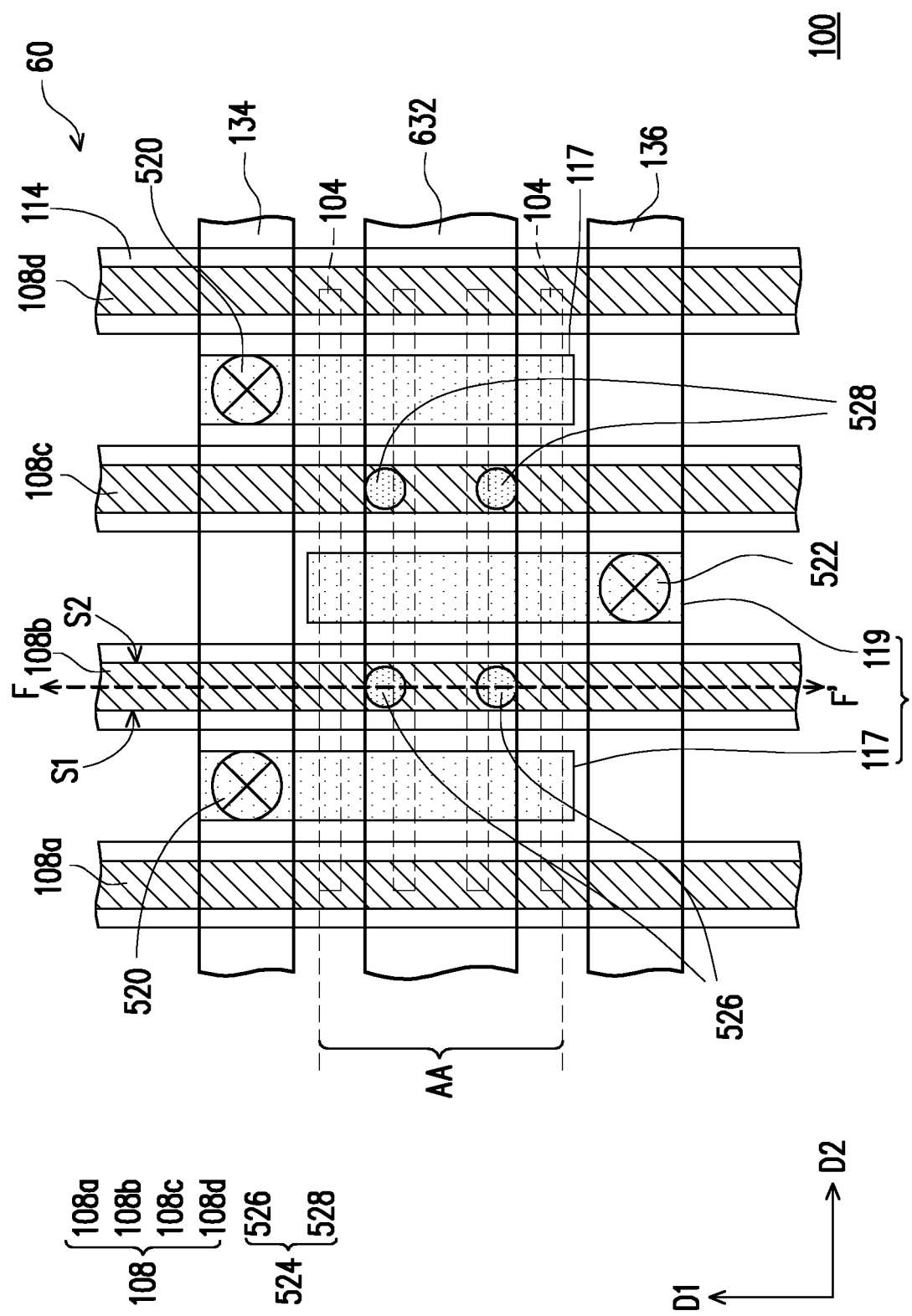
FIG. 7A is a top view of a semiconductor device in accordance with a sixth embodiment.
Figure 7B:
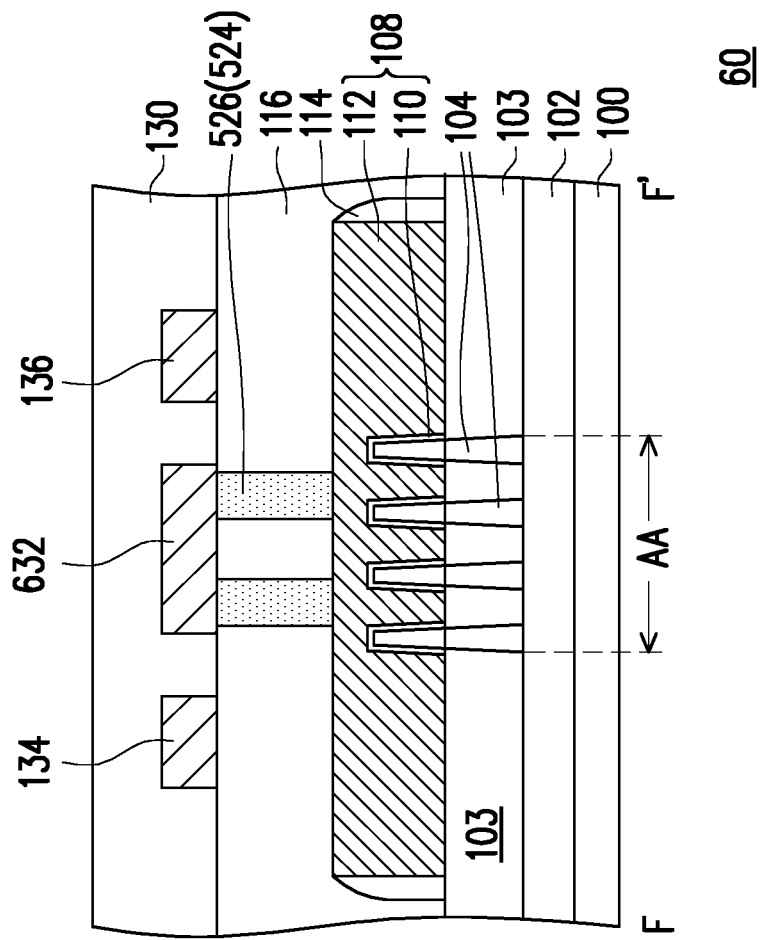
FIG. 7B is a cross-sectional view of line F-F' of FIG. 7A.

FIG. 7A is a top view of a semiconductor device in accordance with a sixth embodiment. FIG. 7B is a cross-sectional view of line F-F' of FIG. 7A.

Referring to FIG. 7A and FIG. 7B, a semiconductor device 60 of the sixth embodiment is similar to the semiconductor device 50 of the fifth embodiment. Since the materials and arrangements of the similar components are described in the above embodiments. Thus, details thereof are omitted here. A difference therebetween lies in that the two first metal layers 532 illustrated in FIG. 6A become one wider first metal layer 632 illustrated in FIG. 7A. In addition, the four gate vias 524 (i.e., gate vias 526 and 528) are all disposed between and electrically connected the first metal layer 632 and the gate structure 108b/108c.

Figure 8A:
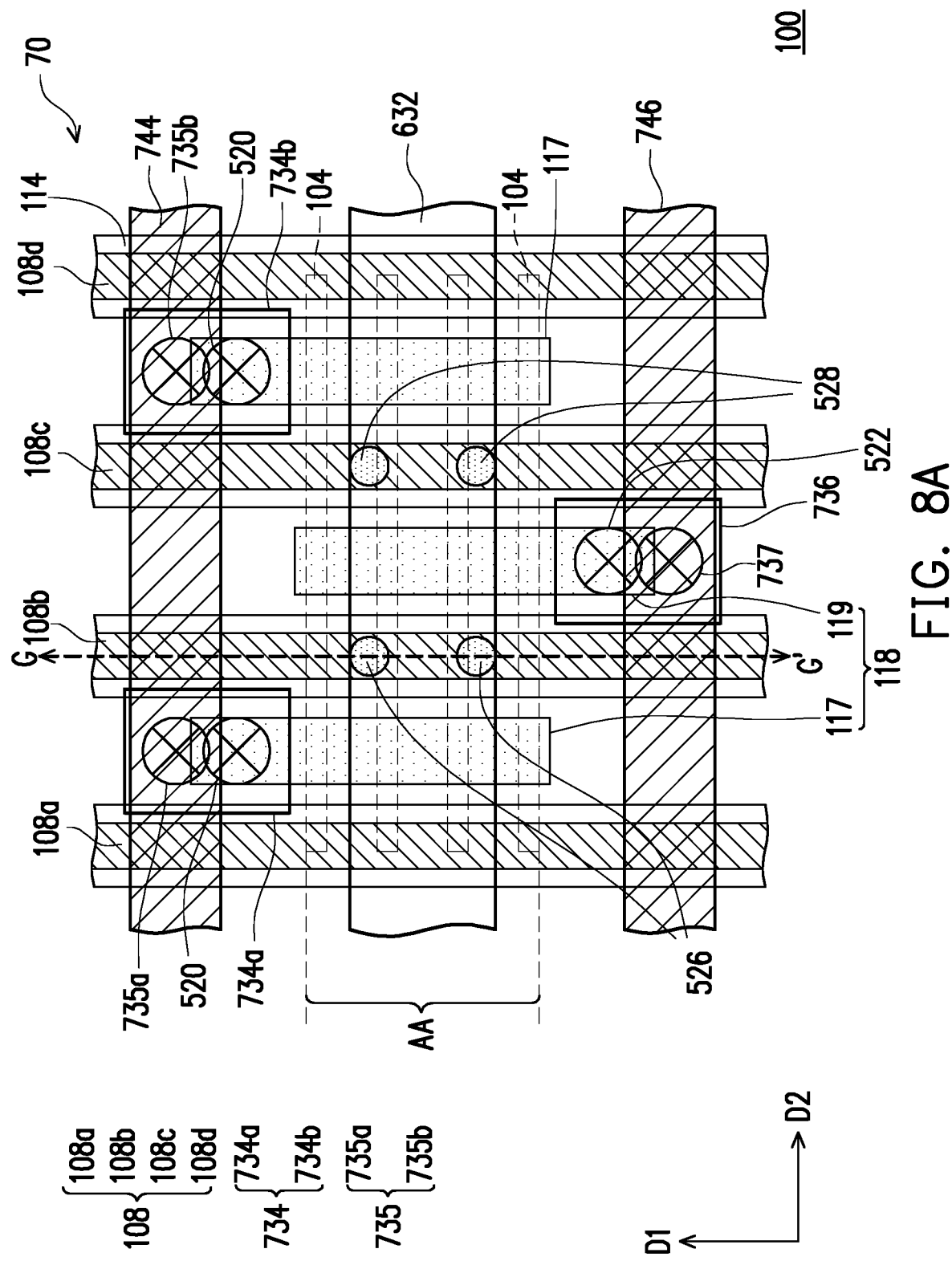
FIG. 8A is a top view of a semiconductor device in accordance with a seventh embodiment.
Figure 8B:
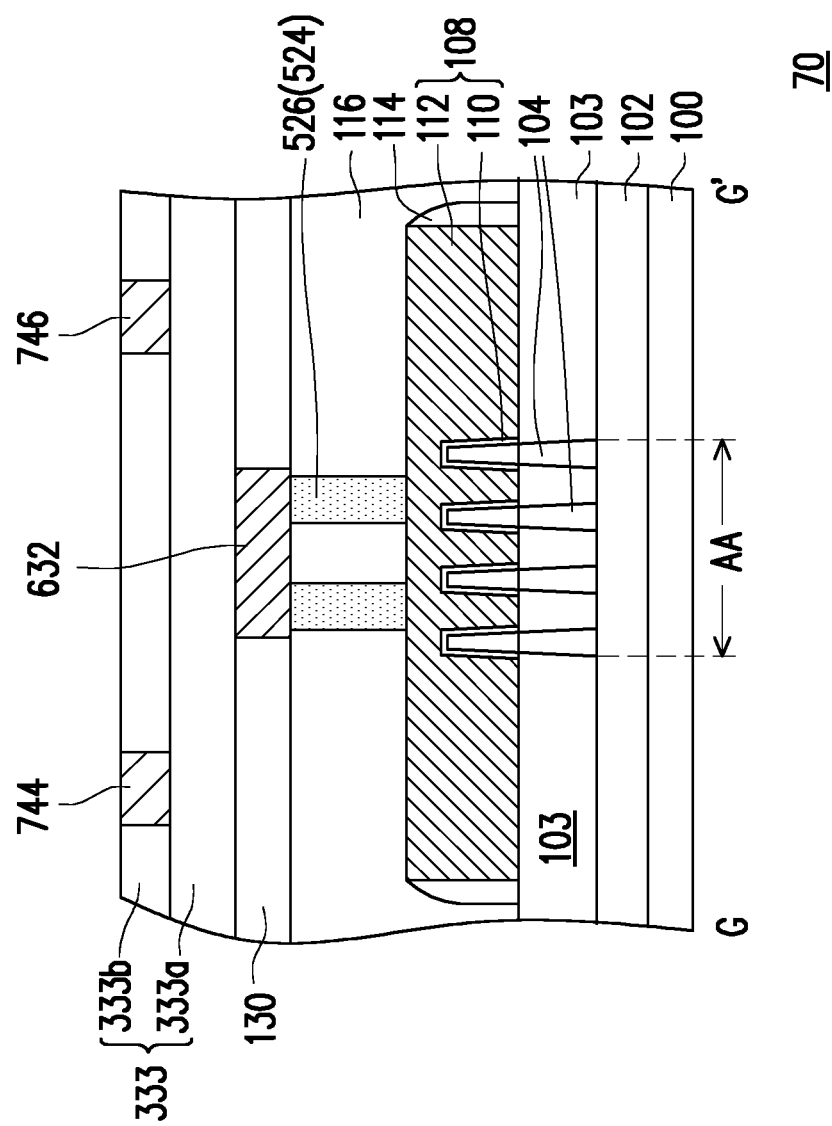
FIG. 8B is a cross-sectional view of line G-G' of FIG. 8A.

FIG. 8A is a top view of a semiconductor device in accordance with a seventh embodiment. FIG. 8B is a cross-sectional view of line G-G' of FIG. 8A.

Referring to FIG. 8A and FIG. 8B, a semiconductor device 70 of the seventh embodiment is similar to the semiconductor device 60 of the sixth embodiment. Since the materials and arrangements of the similar components are described in the above embodiments. Thus, details thereof are omitted here. A difference therebetween lies in that the semiconductor device 70 includes a second metal layers 734, a third metal layer 736, a fourth metal layer 744, two first vias 735, a fifth metal layer 746, and a second via 737.

In detail, the second metal layers 734 are similar to the second metal layers 334 (shown in FIG. 4A). The second metal layers 734 includes two second metal layers 734a and 734b separated from each other. The second metal layers 734a is disposed between adjacent the first gate structure 108a and the second gate structure 108b, and separated from the first metal layer 632. The second metal layers 734b is disposed between adjacent the third gate structure 108c and the fourth gate structure 108d, and separated from the first metal layer 632. The fourth metal layer 744 is disposed over the second metal layers 734a and 734b and is across the gate structures 108. One first via 735a is disposed between and electrically connected the fourth metal layer 744 and the second metal layer 734a, and another first via 735b is disposed between and electrically connected the fourth metal layer 744 and the second metal layer 734b.

In addition, the third metal layers 736 are similar to the third metal layers 336 (shown in FIG. 4A). The third metal layer 736 is disposed between adjacent the second gate structure 108b and the third gate structure 108c, and separated from the first metal layer 632. The fifth metal layer 746 is disposed over the third metal layer 736 and across the gate structures 108. The second via 737 is disposed between and electrically connected the fifth metal layer 746 and the third metal layer 736.

In some embodiments, the first metal layer 632, the second metal layers 734a and 734b, and the third metal layer 736 are formed in dielectric layer 130 and referred to as metal one (M1). That is, the first metal layer 632, the second metal layers 734a and 734b, and the third metal layer 736 are substantially at the same level. In some alternative embodiments, the fourth metal layer 744 and the fifth metal layer 746 are formed in the dielectric layer 333b and referred to as metal two (M2). That is, the fourth metal layer 744 and the fifth metal layer 746 are substantially at the same level. The M2 is higher than the M1. The first vias 735a and 735b, and the second via 737 is disposed between and electrically connected the fourth metal layer 744 and the second metal layer 734b are formed in the dielectric layer 333a and electrically connected the M1 and the M2. Further, as shown in FIG. 4B, the first metal layer 632, fourth metal layer 744, and the fifth metal layer 746 are disposed in a staggered arrangement. In the case, a capacitance between the M1 and M2 decreases, so that a RC delay of the semiconductor device 70 is improved, thereby enhancing a performance of the semiconductor device 70.

Figure 9A:
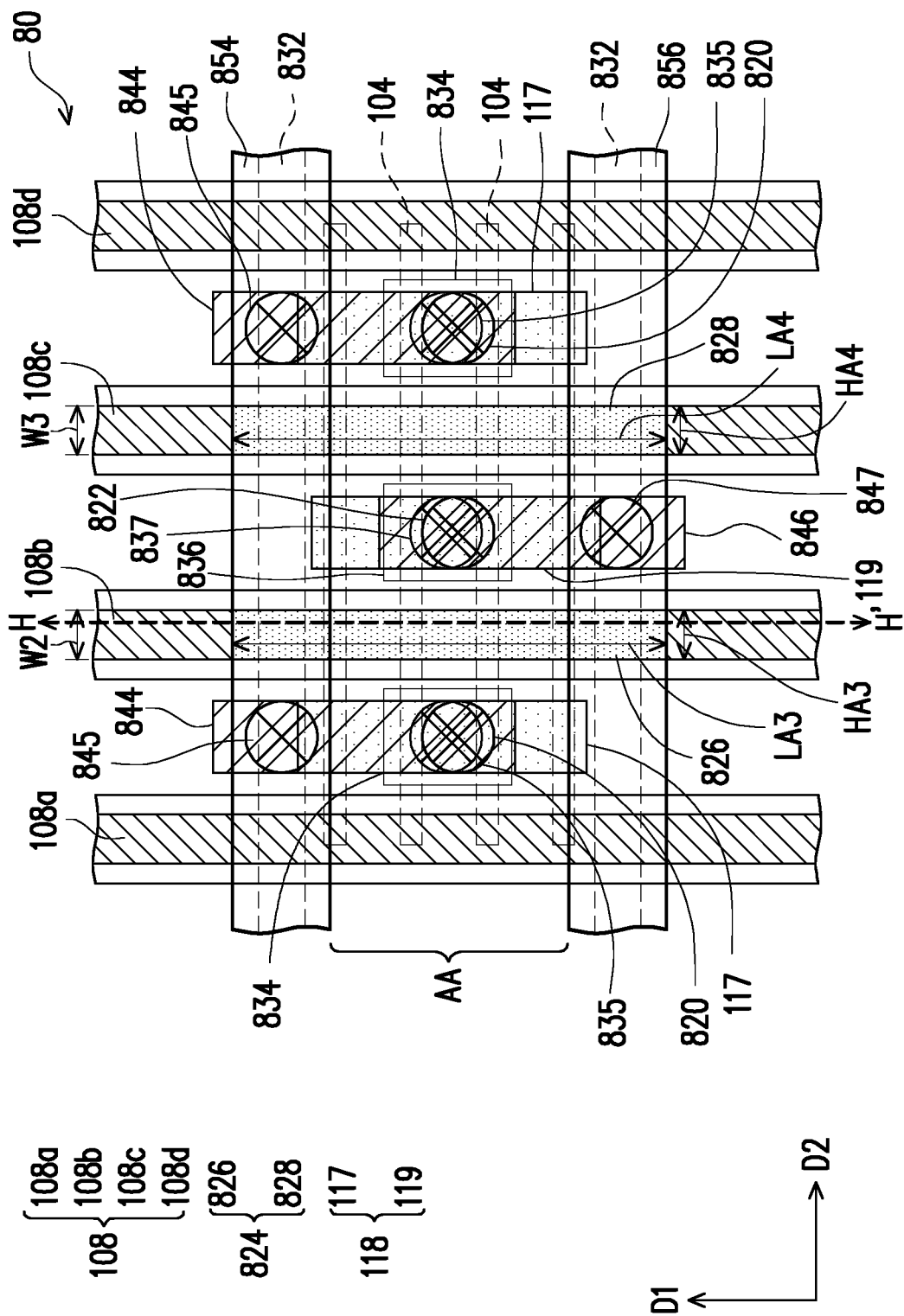
FIG. 9A is a top view of a semiconductor device in accordance with an eighth embodiment.
Figure 9B:
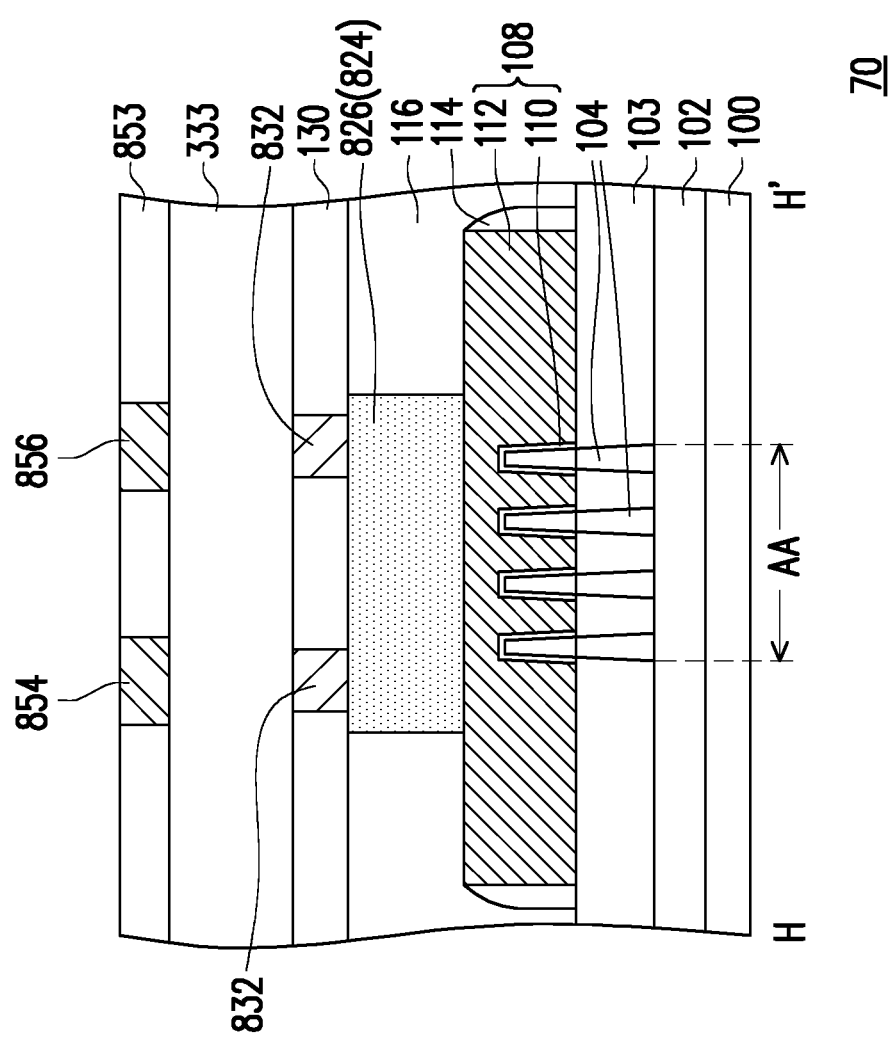
FIG. 9B is a cross-sectional view of line H-H' of FIG. 9A.

FIG. 9A is a top view of a semiconductor device in accordance with an eighth embodiment. FIG. 9B is a cross-sectional view of line H-H' of FIG. 9A.

Referring to FIG. 9A and FIG. 9B, a semiconductor device 70 of the seventh embodiment is similar to the semiconductor device 10 of the first embodiment. Since the materials and arrangements of the similar components are described in the above embodiments. Thus, details thereof are omitted here. A difference therebetween lies in that the semiconductor device 70 includes two gate vias 824, two source vias 820, a drain via 822, two first metal layer 832, a second metal layer 834, a third metal layer 836, two first vias 835, a second via 837, two fourth metal layers 844, a fifth metal layer 846, two third vias 845, a sixth metal layer 854, a fourth via 847, and a seventh metal layer 856.

In detail, the first metal layers 832 extend along the second direction D2 and are across the gate structures 108 (108a, 108b, 108c and 108d). Although only two first metal layers 832 are illustrated in FIG. 9A, the number of the first metal layers 832 is not limited thereto. As shown in FIG. 9A, the two first metal layers 832 are disposed on two sides of the active region AA respectively. The gate vias 824 are disposed over the gate structures 108 respectively and extend along the first direction D1.

One of the gate vias 826 is disposed between the second gate structures 108b and the first metal layers 832, and another of the gate vias 824 is disposed between the third gate structures 108c and the first metal layers 832. The gate via 826 has a longitudinal axis LA3 and a horizontal axis HA3 perpendicular to each other. The longitudinal axis LA3 extends along the first direction D1. The longitudinal axis LA3 of the gate via 826 is across the active region AA. In some embodiments, the longitudinal axis LA3 of the gate via 826 may extend between or extend beyond the two first metal layers 832. A length of the horizontal axis HA3 is less than or equal to the width W2 of the second gate structure 108b. Namely, the horizontal axis HA3 is within a range of the second gate structure 108b.

Similarly, the gate via 828 has a longitudinal axis LA4 and a horizontal axis HA4 perpendicular to each other. The longitudinal axis LA4 extends along the first direction D1. The longitudinal axis LA4 of the gate via 828 is across the active region AA. In some embodiments, the longitudinal axis LA4 of the gate via 828 may extend between or extend beyond the two first metal layers 832. A length of the horizontal axis HA4 is less than or equal to a width W3 of the third gate structure 108c. Namely, the horizontal axis HA4 is within a range of the third gate structure 108c.

It should be noted that the length of the longitudinal axis LA3/LA4 of the gate via 826/828 extend beyond the active region AA. In the case, a contact area between the gate via 826/828 and the gate structure 108b/108c increases, so as to decrease a gate resistance between the gate via 826/828 and the gate structure 108b/108c. Therefore, a RC delay of the semiconductor device 80 is improved, thereby enhancing a performance of the semiconductor device 80 and achieving high speed circuit applications. The layout illustrated in FIG. 9A to reduce the gate resistance is suitable for driver circuit, high frequency analog circuit, and SerDes circuit speed improvement. In an embodiment, the semiconductor device 80 may be a high speed or high driver current transistor. In another embodiment, the semiconductor device 80 may be used in SerDes circuit, SRAM macro word-line driver circuit, or a combination thereof.

In addition, as shown in FIG. 9A, the two second metal layers 834 are disposed between the two first metal layers 832 and separated from each other. Specifically, one of the second metal layers 834 is disposed between adjacent the first gate structure 108*a* and the second gate structure 108*b*, and another of the second metal layers 834 is disposed between adjacent the third gate structure 108*c* and the fourth gate structure 108*d*. The two fourth metal layers 844 are disposed over the second metal layers 834 respectively. The fourth metal layers 844 extend from the active region AA to cover one of the two first metal layers 832. The first via 835 is disposed between and electrically connected the fourth metal layer 844 and the second metal layer 834.

In some embodiments, the second metal layers 834 are directly over the active region AA and the fourth metal layers 844, the first via 835, the second metal layers 834, the source vias 820, the first contact 117, and the S/D structures (i.e., a source) overlap to each other. In the case, the conductive path from the source through the first contact 117, the source vias 820, the second metal layers 834, and the first via 835 to the fourth metal layers 844 decreases, thereby reducing the source resistance.

On the other hand, the third metal layers 836 is disposed between the two first metal layers 832 and separated from each other. The third metal layers 836 is disposed between adjacent the second gate structure 108*b* and the third gate structure 108*c*. The fifth metal layer 846 is disposed over the third metal layers 836. The fifth metal layer 846 extends from the active region AA to cover another one of the two first metal layers 832. The second via 837 is disposed between and electrically connected the fifth metal layer 846 and the third metal layers 836.

In some alternative embodiments, the third metal layer 836 is directly over the active region AA and the fifth metal layer 846, the second via 837, the third metal layers 836, the drain via 822, the second contact 119, and the S/D structures (i.e., a drain) overlap to each other. In the case, the conductive path from the drain through the second contact 119, the drain via 822, the third metal layers 836, and the second via 837 to the fifth metal layer 846 decreases, thereby reducing the drain resistance.

In an embodiment, the first metal layers 832, the second metal layer 834, and the third metal layer 836 are referred to as metal one (M1). That is, the first metal layers 832, the second metal layer 834, and the third metal layer 836 are substantially at a same level. In another embodiment, the fourth metal layers 844 and the fifth metal layer 846 are referred to as metal two (M2). That is, the fourth metal layers 844 and the fifth metal layer 846 are substantially at a same level.

Further, the sixth metal layer 854 and the seventh metal layer 856 are disposed in a dielectric layer 853. In detail, the sixth metal layer 854 is disposed over one of the first metal layers 832 and extends along the second direction D2. The two third vias 845 are respectively disposed between and electrically connected the one of the first metal layers 832 and the sixth metal layer 854. In some embodiments, the sixth metal layer 854 is referred to as a common source, so that the source vias 820 are connected in parallel. In an embodiment, the sixth metal layer 854 is parallel to the first metal layers 832 and perpendicular to the fourth metal layers 844.

The seventh metal layer 856 is disposed over another of the first metal layers 832 and extends along the second direction D2. The fourth via 847 is disposed between and electrically connected the another of the first metal layers 832 and the seventh metal layer 856. In some embodiments, the seventh metal layer 856 is referred to as a common drain, so that the drain via 822 including a plurality of drain vias are connected in parallel. In another embodiment, the seventh metal layer 856 is parallel to the first metal layers 832 and perpendicular to the fifth metal layers 846.

In other embodiments, the sixth metal layer 854 and the seventh metal layer 856 are referred to as metal three (M3). That is, the sixth metal layer 854 and the seventh metal layer 856 are substantially at a same level. In alternative embodiments, the M3 is higher than the M2, and the M2 is higher than the M1.

In accordance with some embodiments of the disclosure, a semiconductor device includes a substrate, a gate structure, a first metal layer, and a gate via. The substrate has at least three semiconductor fins to define an active region. The gate structure is across the at least three semiconductor fins and extends along a first direction. The first metal layer extends along a second direction and is disposed over the gate structure. The gate via is disposed between the gate structure and the first metal layer. The gate via has a longitudinal axis extending along the first direction and across the first metal layer. A length of the longitudinal axis of the gate via is greater than a width of the first metal layer.

In accordance with alternative embodiments of the disclosure, a semiconductor device includes a substrate, a gate structure, a source, a drain, at least two gate vias, a source via, a drain via. The substrate has at least three semiconductor fins to define an active region. The gate structure is across the at least three semiconductor fins. The source is disposed on the at least three semiconductor fins at one side of the gate structure. The drain is disposed on the at least three semiconductor fins at another side of the gate structure. The at least two gate vias are disposed over the gate structure within the active region. The source via is disposed over the source. The drain via is disposed over the drain. A horizontal cross-sectional area of the source via or the drain via is greater than a horizontal cross-sectional area of one of the at least two gate vias.

In accordance with some embodiments of the disclosure, a semiconductor device includes a substrate, a gate structure, at least two first metal layers, and a gate via. The substrate has at least three semiconductor fins to define an active region. The gate structure is across the at least three semiconductor fins and extends along a first direction. The at least two first metal layers extend along a second direction and are disposed on two sides of the active region respectively. The gate via is disposed between the gate structure and the at least two first metal layers. The gate via has a longitudinal axis extending along the first direction, and the longitudinal axis of the gate via is across the active region.

The foregoing outlines features of several embodiments so that those skilled in the art may better understand the aspects of the disclosure. Those skilled in the art should appreciate that they may readily use the disclosure as a basis for designing or modifying other processes and structures for carrying out the same purposes and/or achieving the same advantages of the embodiments introduced herein. Those skilled in the art should also realize that such equivalent constructions do not depart from the spirit and scope of the disclosure, and that they may make various changes, substitutions, and alterations herein without departing from the spirit and scope of the disclosure.

What is claimed is:

1. A semiconductor device, comprising:
a substrate, having at least three semiconductor fins to define an active region;
at least one gate structure, across the at least three semiconductor fins and extending along a first direction;
a first metal layer, extending along a second direction and disposed over the at least one gate structure, wherein the first metal layer comprises a width along the first direction and a length along the second direction, and the length of the first metal layer is greater than a width of the at least one gate structure along the second direction; and
at least one gate via, disposed between the at least one gate structure and the first metal layer, wherein the at least one gate via has a longitudinal axis extending along the first direction and a horizontal axis extending along the second direction, a length of the longitudinal axis is greater than a length of the horizontal axis, and the length of the longitudinal axis of the at least one gate via is greater than the width of the first metal layer.

2. The semiconductor device of claim 1, wherein the longitudinal axis of the at least one gate via is included within a range of the active region.

3. The semiconductor device of claim 1, wherein a length of the horizontal axis of the at least one gate via is less than or equal to a width of the at least one gate structure.

4. The semiconductor device of claim 1, wherein the at least one gate structure comprises a plurality of gate structures, the at least one gate via comprises a plurality of gate vias, and the plurality of gate structures are electrically connected together by the plurality of gate vias and the first metal layer.

5. The semiconductor device of claim 4, further comprising:
a second metal layer, disposed between adjacent a first gate structure and a second gate structure of the plurality of gate structures, and separated from the first metal layer;
a first contact, disposed between adjacent the first gate structure and the second gate structure of the plurality of gate structures, and across the at least three semiconductor fins;
a source via, disposed between and electrically connected to the second metal layer and the first contact;
a fourth metal layer, disposed over the second metal layer;
a first via, disposed between and electrically connected to the fourth metal layer and the second metal layer;
a third metal layer, disposed between adjacent the second gate structure and a third gate structure of the plurality of gate structures, and separated from the first metal layer, wherein the first metal layer is disposed between the second metal layer and the third metal layer;
a second contact, disposed between adjacent the second gate structure and the third structure of the plurality of gate structures, and across the at least three semiconductor fins;
a drain via, disposed between and electrically connected to the third metal layer and the second contact;
a fifth metal layer, disposed over the third metal layer;
a second via, disposed between and electrically connected to the fifth metal layer and the third metal layer;
a sixth metal layer, disposed over the first metal layer and extending along the first direction; and
a third via, disposed between and electrically connected to the sixth metal layer and the first metal layer.

6. The semiconductor device of claim 5, wherein the fourth metal layer, the fifth metal layer, and the sixth metal layer are at a same level.

7. The semiconductor device of claim 4, wherein the length of the first metal layer is across at least two gate structures.

8. The semiconductor device of claim 1, wherein the at least one gate via is located directly above the at least three semiconductor fins.

9. A semiconductor device, comprising:
a substrate, having at least three semiconductor fins;
at least one gate structure, comprising a length along a first direction and a width along a second direction, wherein the length of the at least one gate structure is across the at least three semiconductor fins;
at least one gate via, disposed on and in contact with the at least one gate structure, wherein the at least one gate via has a longitudinal axis extending along the first direction and a horizontal axis extending along the second direction, a length of the longitudinal axis is greater than a length of the horizontal axis, and the length of the horizontal axis of the at least one gate via is less than or equal to the width of the at least one gate structure; and
a first metal layer, disposed on the at least one gate via, wherein the first metal layer comprises a width along the first direction and a length along the second direction, and the length of the first metal layer is greater than the width of the at least one gate structure.

10. The semiconductor device of claim 9, wherein the at least one gate via is located directly above the at least three semiconductor fins.

11. The semiconductor device of claim 9, wherein the at least one gate structure comprises a plurality of gate structures, the at least one gate via comprises a plurality of gate vias, and the plurality of gate structures are electrically connected together by the plurality of gate vias and the first metal layer.

12. The semiconductor device of claim 9, wherein the longitudinal axis of the at least one gate via is located within a range of an active region defined by the at least three semiconductor fins.

13. The semiconductor device of claim 9, further comprising:
a first contact, disposed across the at least three semiconductor fins;
a second metal layer, disposed on the first contact;
a source via, disposed between and electrically connected to the second metal layer and the first contact;
a fourth metal layer, disposed over the second metal layer; and
a first via, disposed between and electrically connected to the fourth metal layer and the second metal layer.

14. The semiconductor device of claim 13, further comprising:
a second contact, disposed across the at least three semiconductor fins;
a third metal layer, disposed on the second contact;
a drain via, disposed between and electrically connected to the third metal layer and the second contact;
a fifth metal layer, disposed over the third metal layer; and
a second via, disposed between and electrically connected to the fifth metal layer and the third metal layer.

15. The semiconductor device of claim 14, wherein the fourth metal layer and the fifth metal layer are at a same level, and respectively located at opposite sides of an active region defined by the at least three semiconductor fins.

16. A semiconductor device, comprising:
   a substrate, having at least three semiconductor fins;
   a plurality of gate structures, across the at least three semiconductor fins and extending along a first direction;
   a first metal layer, extending along a second direction and across at least two gate structures; and
   a plurality of gate vias, respectively disposed between the plurality of gate structures and the first metal layer, wherein the plurality of gate structures are electrically connected together by the plurality of gate vias and the first metal layer, wherein one of the plurality of gate vias comprises a longitudinal axis extending along the first direction and a horizontal axis extending along the second direction, a length of the longitudinal axis is greater than a length of the horizontal axis, and the length of the longitudinal axis is greater than a width of the first metal layer along the second direction.

17. The semiconductor device of claim 16, wherein the length of the horizontal axis is less than or equal to a width of a corresponding gate structure along the second direction.

18. The semiconductor device of claim 16, further comprising:
   two first contacts, across the at least three semiconductor fins, wherein one of the two first contacts is disposed between adjacent a first gate structure and a second gate structure of the plurality of gate structures, and another of the two first contacts is disposed between adjacent a third gate structure and a fourth gate structure of the plurality of gate structures; and
   a second contact, disposed between the two first contacts, wherein the second contact is disposed between adjacent the second gate structure and the third gate structure of the plurality of gate structures, and across the at least three semiconductor fins.

19. The semiconductor device of claim 18, further comprising:
   two second metal layers, respectively disposed on the two first contacts, and separated from the first metal layer; and
   a third metal layer, disposed on the second contact and separated from the first metal layer, wherein the first metal layer is disposed between the second metal layer and the third metal layer.

20. The semiconductor device of claim 19, further comprising:
   two source vias, respectively disposed between and electrically connected to the two second metal layers and the two first contacts; and
   a drain via, disposed between and electrically connected to the third metal layer and the second contact.

* * * * *